United States Patent
Natori

(10) Patent No.: US 6,697,280 B2
(45) Date of Patent: Feb. 24, 2004

(54) SEMICONDUCTOR CAPACITANCE DEVICE, BOOSTER CIRCUIT AND NONVOLATILE SEMICONDUCTOR STORAGE DEVICE

(75) Inventor: Kanji Natori, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 14 days.

(21) Appl. No.: 10/197,645

(22) Filed: Jul. 18, 2002

(65) Prior Publication Data

US 2003/0031064 A1 Feb. 13, 2003

(30) Foreign Application Priority Data

Jul. 23, 2001 (JP) .................................... 2001-221790

(51) Int. Cl.$^7$ ............................................. G11C 16/04
(52) U.S. Cl. ............................ 365/185.05; 365/185.11; 365/185.15; 365/189.11
(58) Field of Search ..................... 365/185.05, 185.11, 365/189.11, 185.15

(56) References Cited

U.S. PATENT DOCUMENTS

| | | | | |
|---|---|---|---|---|
| 5,089,875 A | * | 2/1992 | Koyama ..................... | 257/532 |
| 5,408,115 A | | 4/1995 | Chang ........................ | 257/324 |
| 5,422,504 A | | 6/1995 | Chang et al. .......... | 365/185.15 |
| 5,494,838 A | | 2/1996 | Chang et al. ............... | 438/264 |
| 5,497,023 A | * | 3/1996 | Nakazato et al. ........... | 257/394 |
| 5,726,083 A | * | 3/1998 | Takaishi ..................... | 438/210 |
| 5,844,837 A | * | 12/1998 | Yoshikawa .................. | 365/156 |
| 5,872,037 A | * | 2/1999 | Iwamatsu et al. .......... | 438/268 |
| 5,969,383 A | | 10/1999 | Chang et al. ............... | 257/316 |
| 6,177,318 B1 | | 1/2001 | Ogura et al. ............... | 438/267 |
| 6,248,633 B1 | | 6/2001 | Ogura et al. ............... | 438/267 |
| 6,255,166 B1 | | 7/2001 | Ogura et al. ............... | 438/267 |

FOREIGN PATENT DOCUMENTS

| | | |
|---|---|---|
| JP | A 7-161851 | 6/1995 |
| JP | B1 2978477 | 11/1999 |
| JP | A 2001-156188 | 6/2001 |

OTHER PUBLICATIONS

Hayashi et al., "Twin MONOS Cell with Dual Control Gates", 2000, IEEE VLSI Technology Digest.
Chang et al., "A New SONOS Memory Using Source–Side Injection for programming", IEEE Electron Device Letters, vol. 19, No. 7, Jul. 1998, pp. 253–255.
Chen et al., "A Novel Flash Memory Device with S Plit Gate Source Side Injection adn O_O Charge Storgage Stack (SPIN)", 1997, VLSI Technology Digest, pp. 63–34.

* cited by examiner

Primary Examiner—Richard Elms
Assistant Examiner—Tuan T. Nguyen
(74) Attorney, Agent, or Firm—Oliff & Berridge, PLC

(57) ABSTRACT

A semiconductor capacitance device includes a P-type semiconductor layer, an N-type well region which is provided in the P-type semiconductor layer, and a P-type well region which is provided in the N-type well region. Further, the semiconductor capacitance device includes a gate electrode layer which is provided over the P-type well region with an insulating layer interposed therebetween, a first N-type impurity layer which is provided in the P-type well region on one side of the gate electrode layer, and a second N-type impurity layer which is provided in the P-type well region on the other side of the gate electrode layer. The gate electrode layer has at least one through hole, and a third N-type impurity layer is provided in the P-type well region at a position facing the through hole.

14 Claims, 33 Drawing Sheets

FIG. 2A
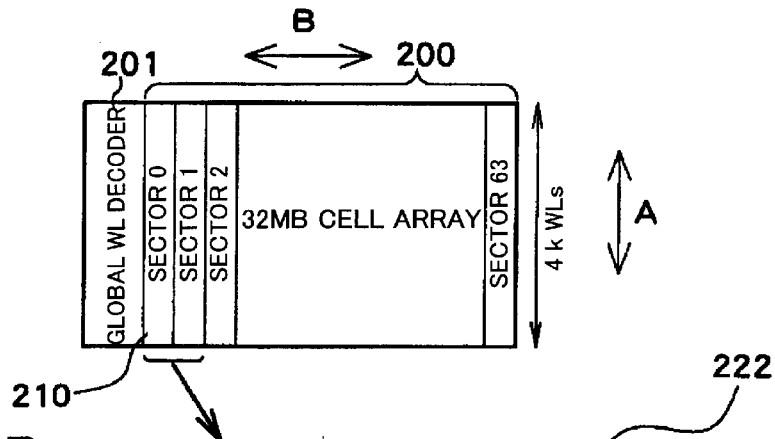
FIG. 2B
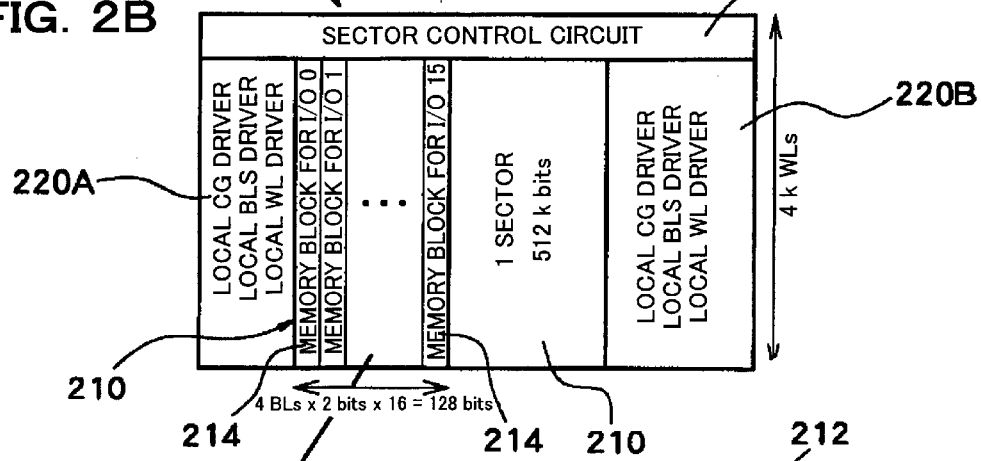
FIG. 2C
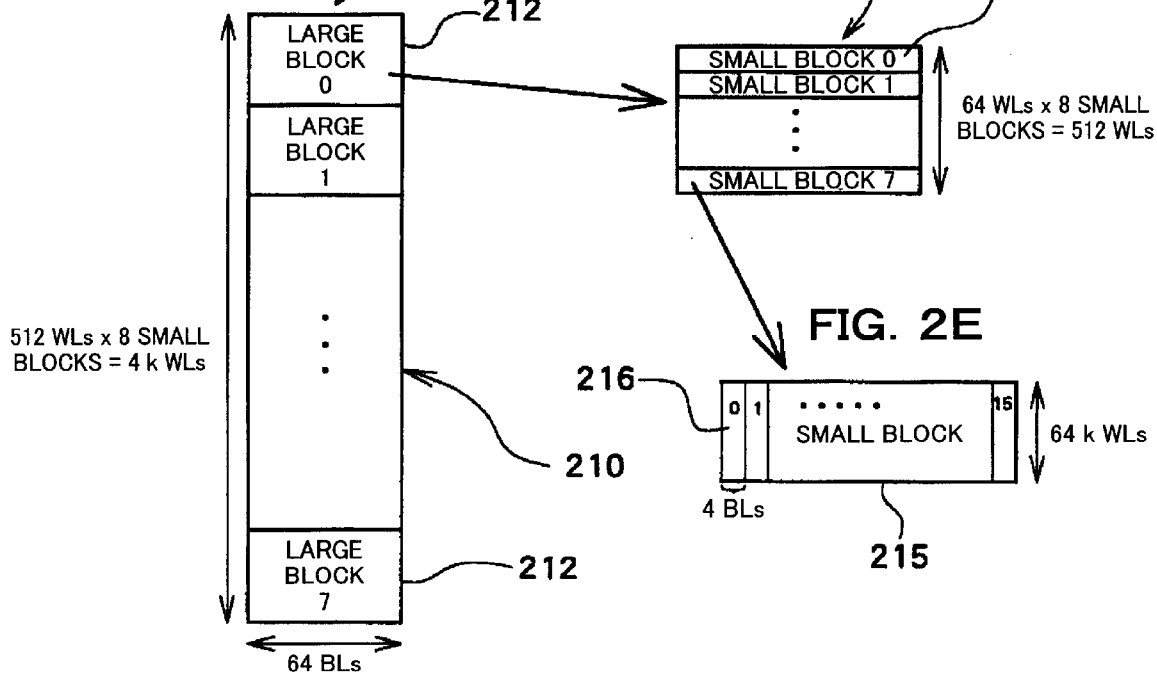
FIG. 2D
FIG. 2E
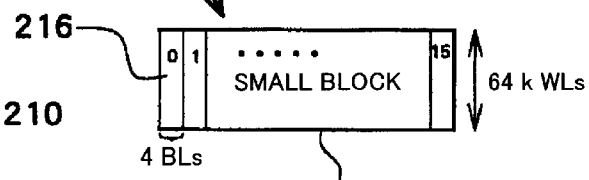

SEMICONDUCTOR CAPACITANCE DEVICE, BOOSTER CIRCUIT AND NONVOLATILE SEMICONDUCTOR STORAGE DEVICE

Japanese Patent Application No. 2001-221790, filed on Jul. 23, 2001, is hereby incorporated by reference in its entirety.

BACKGROUND OF THE INVENTION

The present invention relates to a semiconductor capacitance device, a booster circuit and a nonvolatile semiconductor storage device.

Known as a nonvolatile semiconductor device is the MONOS (Metal-Oxide-Nitride-Oxide-Semiconductor or -Substrate) type wherein the gate insulating layer between a channel and a gate is formed of a laminate consisting of a silicon oxide film, silicon nitride film and silicon oxide film, and where in electric charges are trapped in the silicon nitride film.

The MONOS type nonvolatile semiconductor storage device is disclosed in a literature (Y. Hayashi, et al., in 2000 Symposium on VLSI Technology Digest of Technical Papers, pp. 122 to 123). This literature teaches a MONOS flash memory cell including two nonvolatile memory elements (also termed "MONOS memory elements or cells") which are controlled by one word gate and two control gates. That is, one flash memory cell has two charge-trapping sites.

In operating the MONOS memory elements, voltages higher than a supply voltage are sometimes applied to the control gates, a bit line and a word line. The voltages higher than the supply voltage are generated by a booster circuit which includes a capacitance element. On the other hand, the MONOS memory element consumes a large current, thereby the size of the capacitance element in the booster circuit needs to be enlarged. However, in a case where the capacitance element is constructed of a MOS capacitor, the distance between the source and drain regions is increased by enlarging the size of the capacitance element. In a region spaced from the source and drain regions, therefore, an inversion layer becomes difficult to be formed on account of increase in a substrate resistance.

BRIEF SUMMARY OF THE INVENTION

The present invention may provide a semiconductor capacitance device in which an inversion layer is easily formed.

The present invention may also provide a booster circuit which employs the semiconductor capacitance device of the present invention as a boosting capacitor.

Furthermore, the present invention may provide a nonvolatile semiconductor storage device which generates the drive voltage of a nonvolatile storage element by the booster circuit of the present invention.

According to the first aspect of the present invention, a semiconductor capacitance device comprises:

a P-type semiconductor layer;

an N-type well region which is provided in the P-type semiconductor layer;

a P-type well region which is provided in the N-type well region;

an electrode layer which is provided over the P-type well region with an insulating layer interposed therebetween;

a first N-type impurity layer which is provided in the P-type well region on one side of the electrode layer; and a second N-type impurity layer which is provided in the P-type well region on the other side of the electrode layer, wherein the electrode layer has at least one through hole; and wherein a third N-type impurity layer is provided in the P-type well region at a position facing the through hole.

In the first aspect of the present invention, the third N-type impurity layer is formed in that part of the P-type well region at a position facing the through hole provided in the electrode layer. Accordingly, the third N-type impurity layer is provided between the first N-type impurity layer and the second N-type impurity layer, and thus the resistance between the source and drain regions can be reduced. As a result, the inversion layer of the MOS capacitor is easily formed even in a region which is spaced from the first and second N-type impurity layers.

Besides, in the first aspect of the present invention, a triple well structure is adopted which is formed of the P-type semiconductor layer, the N-type well region and the P-type well region. Therefore, voltage characteristics of the MOS capacitor can be enhanced on the low voltage side thereof.

In this aspect of the present invention, a P-type well contact region may be provided in the P-type well region at a position facing the through hole; and the third N-type impurity layer may be provided so as to surround the P-type well contact region.

Since the P-type well contact region is provided in the P-type well region at a position facing the through hole, the parasitic resistance of the P-type well region can be reduced. As a result, voltage characteristics of the MOS capacitor can be further enhanced.

According to the second aspect of the present invention, a semiconductor capacitance device comprises:

a P-type semiconductor layer;

an N-type well region which is provided in the P-type semiconductor layer;

an electrode layer which is provided over the N-type well region with an insulating layer interposed therebetween;

a first P-type impurity layer which is provided in the N-type well region on one side of the electrode layer; and a second P-type impurity layer which is provided in the N-type well region on the other side of the electrode layer, wherein the electrode layer has at least one through hole; and wherein a third P-type impurity layer is provided in the N-type well region at a position facing the through hole.

In this aspect of the present invention, the third P-type impurity layer is formed in the N-type well region at a position facing the through hole provided in the electrode layer. Accordingly, the third P-type impurity layer is provided between the first P-type impurity layer and the second P-type impurity layer, and thus the resistance between the source and drain regions can be reduced. As a result, the inversion layer of the MOS capacitor is easily formed even in a region which is spaced from the first and second P-type impurity layers.

In this aspect of the present invention, an N-type well contact region may be provided in the N-type well region at a position facing the through hole; and the third P-type impurity layer may be provided so as to surround the N-type well contact region.

Since the N-type well contact region is provided in that part of the N-type well region at a position facing the through hole, the parasitic resistance of the N-type well region can be reduced. As a result, voltage characteristics of the MOS capacitor can be further enhanced.

In the semiconductor capacitance device according to the first and second aspects of the present invention, the electrode layer may have a plurality of the through holes which are arranged in first and second directions intersecting each other.

According to the third aspect of the present invention, a booster circuit comprises the semiconductor capacitance device as defined in the first or second aspect of the present invention, as a boosting capacitor.

According to the fourth aspect of the present invention, a nonvolatile semiconductor storage device comprises:

the booster circuit as defined in the third aspect of the present invention;

a memory cell array including a plurality of nonvolatile semiconductor storage elements; and a drive circuit which drives the nonvolatile semiconductor storage elements on the basis of an output of the booster circuit.

Here, each of the nonvolatile semiconductor storage elements may include one word gate, and first and second nonvolatile memory elements which are controlled by first and second control gates.

Besides, each of the first and second nonvolatile memory elements may include an ONO film formed of an oxide film (O), a nitride film (N) and an oxide film (O), as a trap site for electric charges, and data may be programmed in the trap site.

BRIEF DESCRIPTION OF THE SEVERAL VIEWS OF THE DRAWING

FIG. 2A is a plan layout view of the whole nonvolatile semiconductor storage device shown in FIG. 1, FIG. 2B is a plan view of two sector areas in FIG. 2A, FIG. 2C is a plan view of one sector area in FIG. 2B, FIG. 2D is a plan view of one large block in FIG. 2C, and FIG. 2E is a plan view of one small block in FIG. 2D;

DETAILED DESCRIPTION OF THE EMBODIMENT

Now, embodiments of the present invention will be described with reference to the drawings.

Memory Cell Structure

Figure 1:
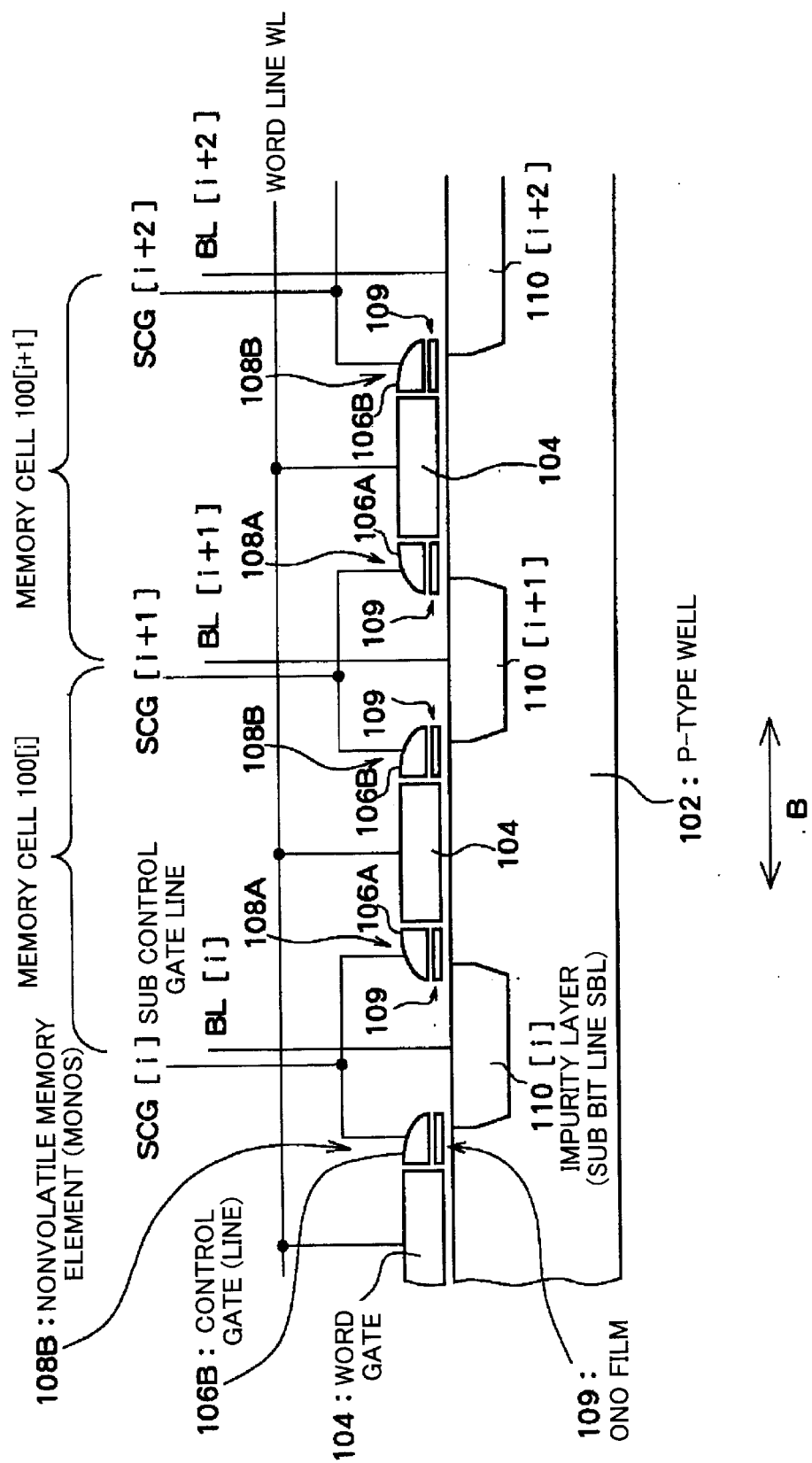
FIG. 1 is a sectional view of memory cells which are employed in a nonvolatile semiconductor storage device according to an embodiment of the present invention.

FIG. 1 shows one section of a nonvolatile semiconductor storage device. Referring to FIG. 1, a memory cell 100 includes a word gate 104 which is formed from a material containing, for example, polysilicon, first and second control gates 106A and 106B, and first and second memory elements (MONOS memory elements) 108A and 108B over a P-type well 102 with a gate insulating film interposed therebetween.

The first and second control gates 106A and 106B are formed at both of the sidewalls of the word gate 104, and they are electrically insulated from the word gate 104, respectively.

Each of the first and second memory elements 108A and 108B is constructed by stacking an oxide film (O), a nitride film (N) and an oxide film (O) between the corresponding one of the first and second control gates 106A and 106B, which are formed of the polysilicon corresponding to the M (metal) of "MONOS", and the P-type well 102 corresponding to the S (semiconductor or substrate). Incidentally, the first and second control gates 106A and 106B can also be made of a conductive material such as silicide.

In this manner, one memory cell 100 includes the first and second MONOS memory elements 108A, 108B having the split gates (first and second control gates 106A, 106B), and one word gate 104 is shared by the first and second MONOS memory elements 108A, 108B.

The first and second MONOS memory elements 108A, 108B function as charge trap sites, respectively. Each of the first and second MONOS memory elements 108A, 108B is capable of trapping electric charges by an ONO film 109.

As shown in FIG. 1, a plurality of word gates 104 which are arrayed at intervals in a row direction (a second direction B in FIG. 1) are connected in common to one word line WL which is formed of a polycide or the like.

Besides, the control gates 106A, 106B shown in FIG. 1 extend in a column direction (a first direction A perpendicular to the sheet of FIG. 1), and they are shared by a plurality of memory cells 100 which are arrayed in the column direction. Therefore, the parts 106A, 106B shall be also termed "control gate lines".

Here, a sub control gate line SCG [i+1] which is formed of a metal layer overlying the word gate, control gates and word line by way of example is connected to the control gate line 106B of the [i]th memory cell 100 [i] and the control gate line 106A of the [i+1]th memory cell 100 [i+1].

The P-type well 102 is provided with an [i+1]th impurity layer 110 [i+1] which is shared by the MONOS memory element 108B of the [i]th memory cell 100 [i] and the MONOS memory element 108A of the [i+1]th memory cell 100 [i+1].

Each of such impurity layers 110 [i], [i+1] and [i+2] is, for example, an N-type impurity layer which is formed in the P-type well, which extends in the column direction (first direction A perpendicular to the sheet of FIG. 1), and which functions as a sub bit line shared by the plurality of memory cells 100 arrayed in the column direction. Therefore, the parts 110 [i], [i+1] and [i+2] shall be also termed "sub bit lines SBL [i], [i+1] and [i+2]".

General Construction of Nonvolatile Semiconductor Storage Device

The general construction of the nonvolatile semiconductor storage device constructed using the above memory cells 100 will be described with reference to FIGS. 2A to 2E.

FIG. 2A is a plan layout view of the nonvolatile semiconductor storage device of single chip, which includes a memory cell array region 200 and a global word line decoder 201. The memory cell array region 200 includes, for example, 0th to 63rd sector areas 210 in the total number of 64.

As shown in FIG. 2A, the 64 sector areas 210 are obtained by dividing the memory cell array region 200 in the second direction (row direction) B, and each sector area 210 has a vertically longer shape whose longitudinal direction is the first direction (column direction) A. A minimum unit for erasing data is each sector area 210, and data stored in the sector areas 210 are erased collectively or in time division.

The memory array area 200 has, for example, 4 k word lines WL and 4 k bit lines BL. Here in this embodiment, the two MONOS memory elements 108A, 108B are connected to one sub bit line SBL, and hence, the 4 k sub bit lines SBL signify a storage capacity of 8 kbits. The storage capacity of each sector area 210 is equal to 1/64 of the storage capacity of the whole memory, and the latter storage capacity is defined by (4 k word lines WL)×(64 bit lines BL)×2.

FIG. 2B shows the details of the two adjacent 0th and 1st sector areas 210 of the nonvolatile semiconductor storage device shown in FIG. 2A. As shown in FIG. 2B, local driver areas (each including a local control gate driver, a local bit line selection driver and a local word line driver) 220A and 220B are arranged on both the sides of the two sectors 210. Besides, a sector control circuit 222 is arranged on, for example, the upper sides of the two sectors 210 and the two local driver areas 220A, 220B.

Each sector area 210 is divided in the second direction, into 16 memory blocks (memory blocks corresponding to input/output bits) 214 for I/O 0 to I/O 15 so that data of 16 bits can be read and written. As shown in FIG. 2B, each memory block 214 has 4 k (4096) word lines WL.

As shown in FIG. 2C, each sector area 210 shown in FIG. 2B is divided into eight large blocks 212 in the first direction A. As shown in FIG. 2D, each large block 212 is divided into eight small blocks 215 in the first direction A.

As shown in FIG. 2E, each small block 215 has 64 word lines WL. Besides, each small block 215 is constituted by 16 small memory blocks 216 which are arrayed in the row direction.

Details of Sector Area

Figure 3:
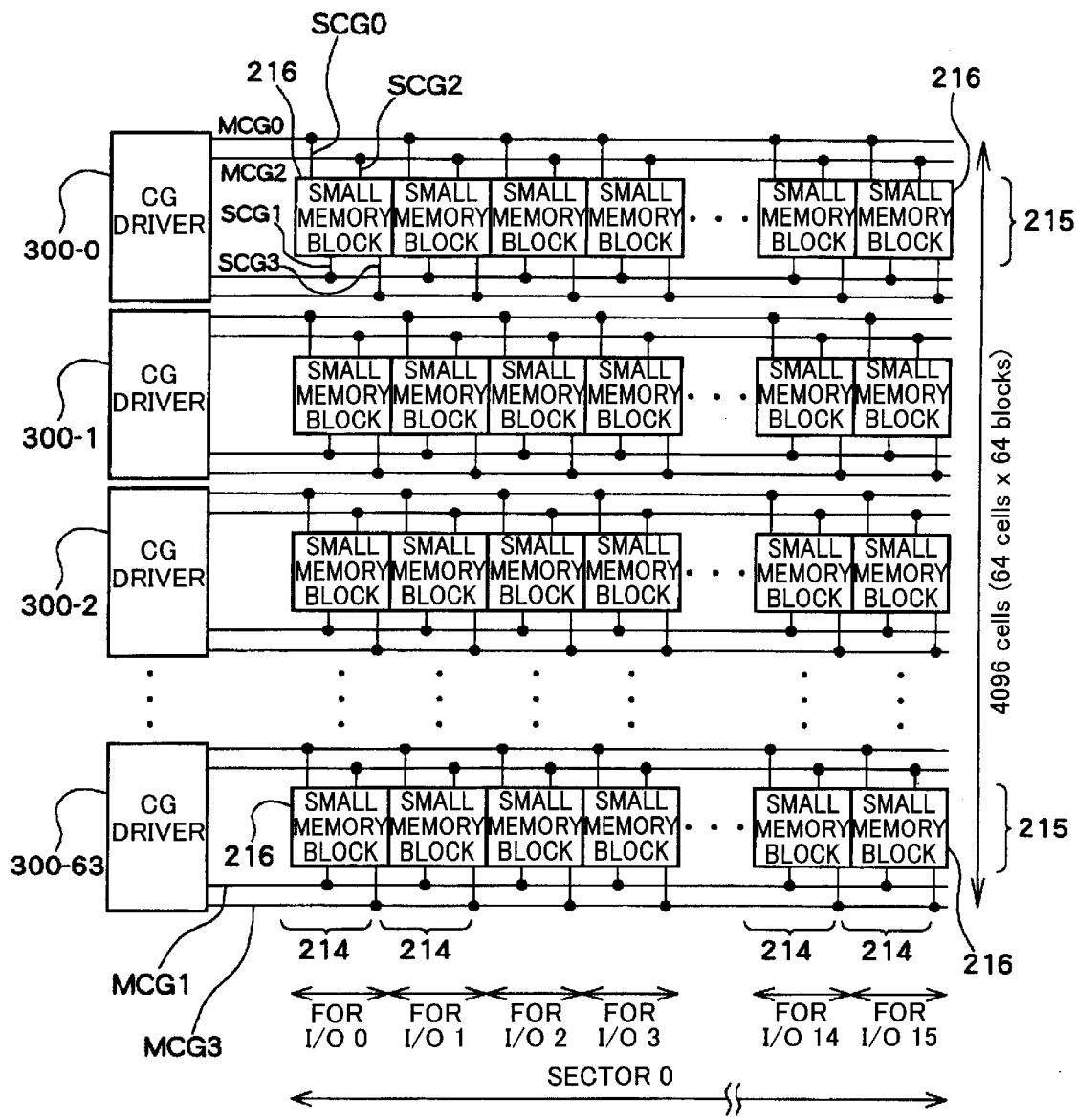
FIG. 3 is a schematic explanatory diagram for explaining the large number of small memory blocks of one sector area shown in FIG. 2B and the wiring lines thereof.
Figure 4:
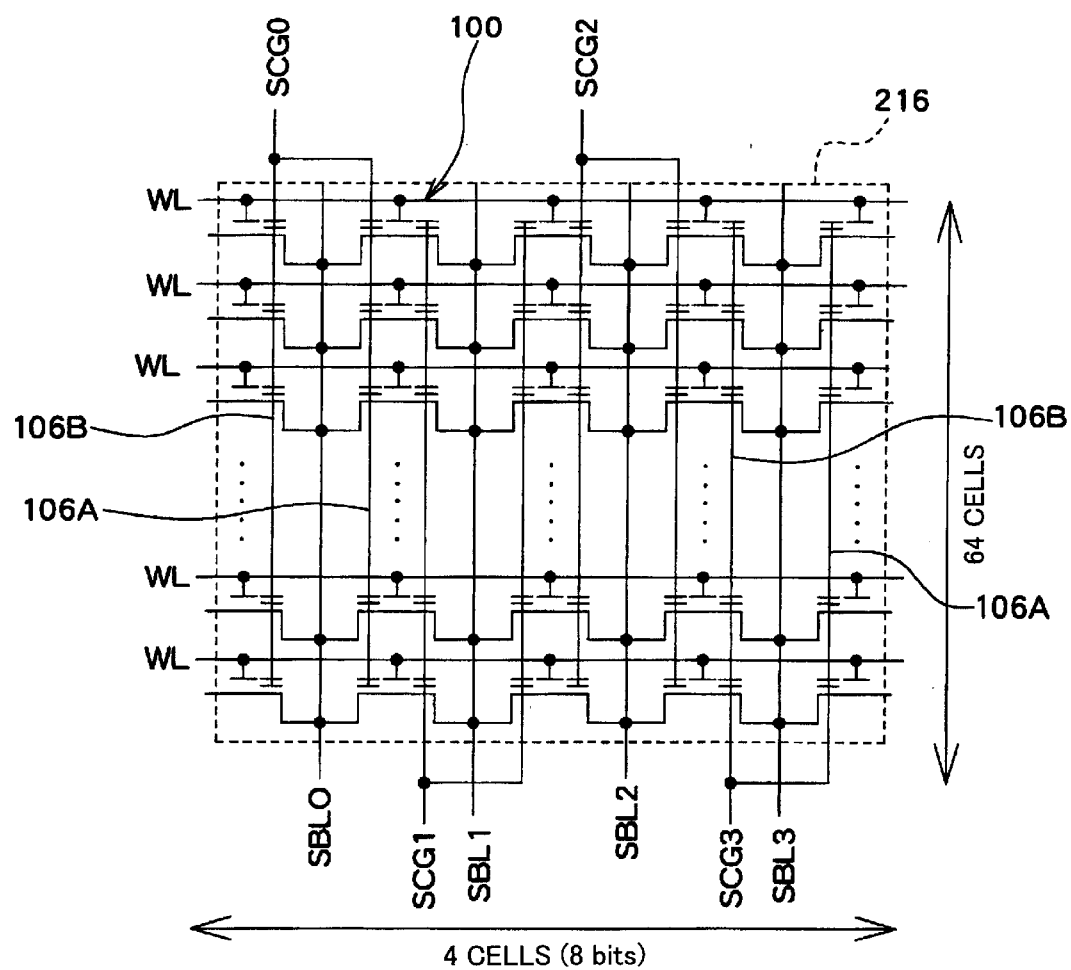
FIG. 4 is a circuit diagram of the small memory block shown in FIG. 3.

FIG. 3 shows the details of the sector area 0 shown in FIG. 2A, and CG drivers. A small memory block 216 shown in FIG. 3 is constructed by arraying the memory cells 100 in the number of, for example, 64 in the column direction and in the number of, for example, 4 in the row direction as shown in FIG. 4. By way of example, four sub control gate lines SCG 0 to SCG 3, four sub bit lines SBL 0 to SBL 3 being data input/output lines, and 64 word lines WL are connected to one small memory block 216.

Here, the second control gates 106B of the respective memory cells of the even-numbered column (0th column or second column), and the first control gates 106A of the respective memory cells of the odd-numbered column (first column or third column) are connected in common to the even-numbered sub control gate line SCG 0 or SCG 2. Likewise, the second control gates 106B of the respective memory cells of the odd-numbered column (first column or third column), and the first control gates 106A of the respective memory cells of the even-numbered column (second column or fourth column) are connected in common to the odd-numbered sub control gate line SCG 1 or SCG 3.

As shown in FIG. 3, the small memory blocks 216 are arrayed in the number of 64 in the column direction within one sector area 210. Besides, the 16 small memory blocks 216 corresponding to the 16 inputs/outputs, I/O 0 to I/O 15 are arrayed in the row direction in order to input/output 16 bits.

The 16 sub control gate lines SCG 0 of the 16 small memory blocks 216 arrayed in the row direction are connected in common to a main control gate line MCG 0 laid in the row direction. Likewise, the 16 sub control gate lines SCG 1 are connected in common to a main control gate line MCG 1, the 16 sub control gate lines SCG 2 to a main control gate line MCG 2, and the 16 sub control gate lines SCG 3 to a main control gate line MCG 3.

The corresponding one of the CG drivers 300-0 through 300-63 constituting a control gate drive unit is disposed in each small block 215 within the sector area 0. The four main control gate lines MCG 0 to MCG 3 extending in the row direction are connected to each of the CG drivers 300-0 through 300-63.

Figure 5:
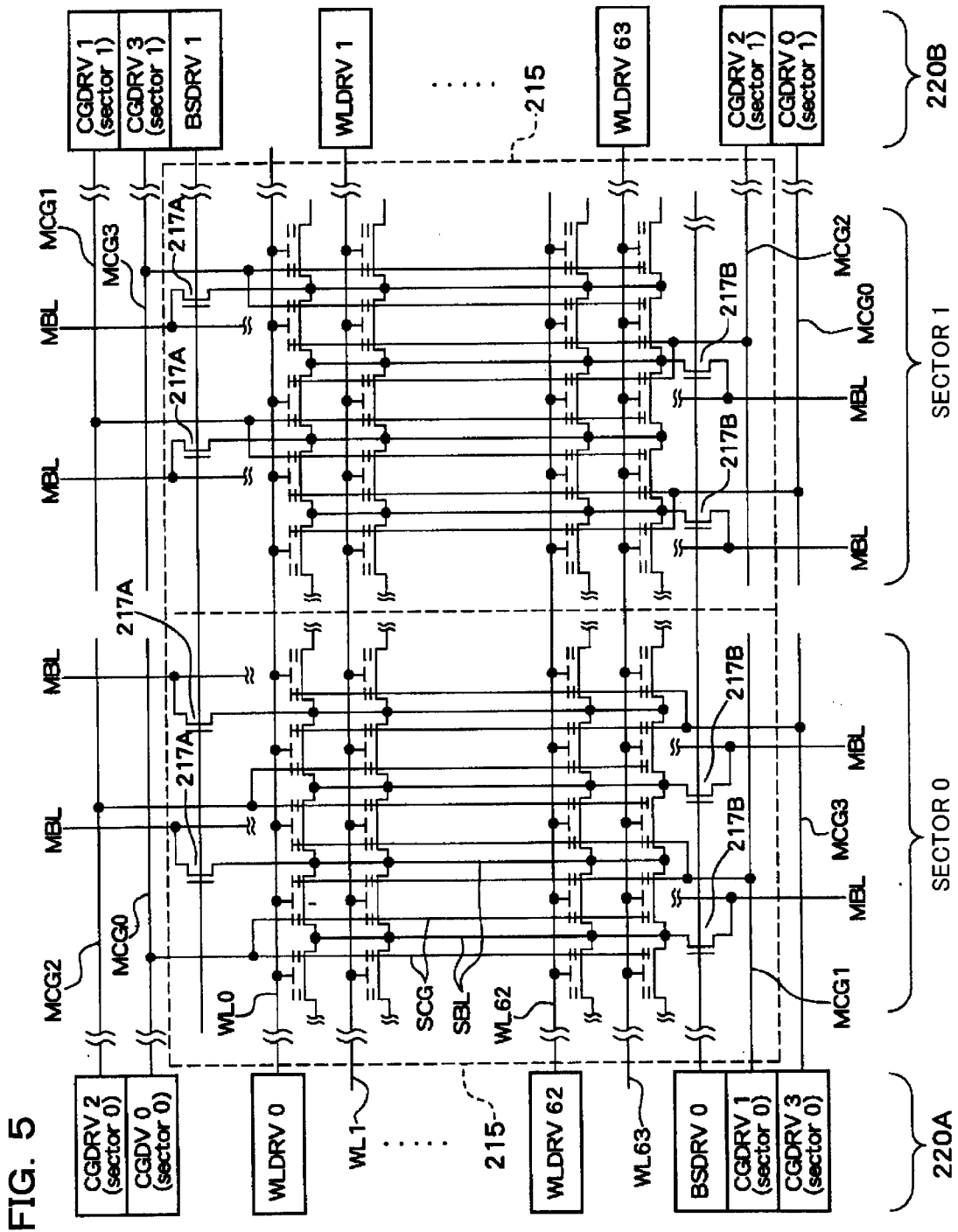
FIG. 5 is a diagram showing the relationship between small blocks and local driver areas shown in FIG. 3.

FIG. 5 shows the relationship between the two small blocks 215 which belong to the sector areas 0 and 1 adjacent to each other, respectively. In the sector areas 0 and 1, the 64 word lines WL 0 to WL 63 are shared, but the main control gate lines MCG 0 to MCG 3 and main bit lines MBL are laid independently of each other. Particularly in FIG. 5, local CG drivers CGDRV 0 to CGDRV 3 corresponding to the small block 215 in the sector area 0, and local CG drivers CGDRV 0 to CGDRV 3 corresponding to the small block 215 in the sector area 1 are shown. The four local CG drivers CGDRV 0 to CGDRV 3 constitute the CG driver 300 in FIG. 3. The CG drivers 300 are disposed independently for the respective small blocks 215.

The four sub bit lines SBL 0 to SBL 3 (impurity layers) arranged every small block 216 are respectively connected to the main bit lines MBL which are metal wiring lines. Each of the main bit lines MBL is shared between the small memory blocks 216 which are arrayed in the column direction (first direction A). Bit line selection gates 217A or 217B which are bit line selection switching elements are arranged midway of respective paths which lead from the main bit lines MBL to the corresponding sub bit lines SBL 0 in the small memory blocks 216. Incidentally, by way of example, the bit line selection gates 217A are respectively connected to the odd-numbered sub bit lines SBL, whereas the bit line selection gates 217B are respectively connected to the even-numbered sub bit lines SBL.

Figure 6:
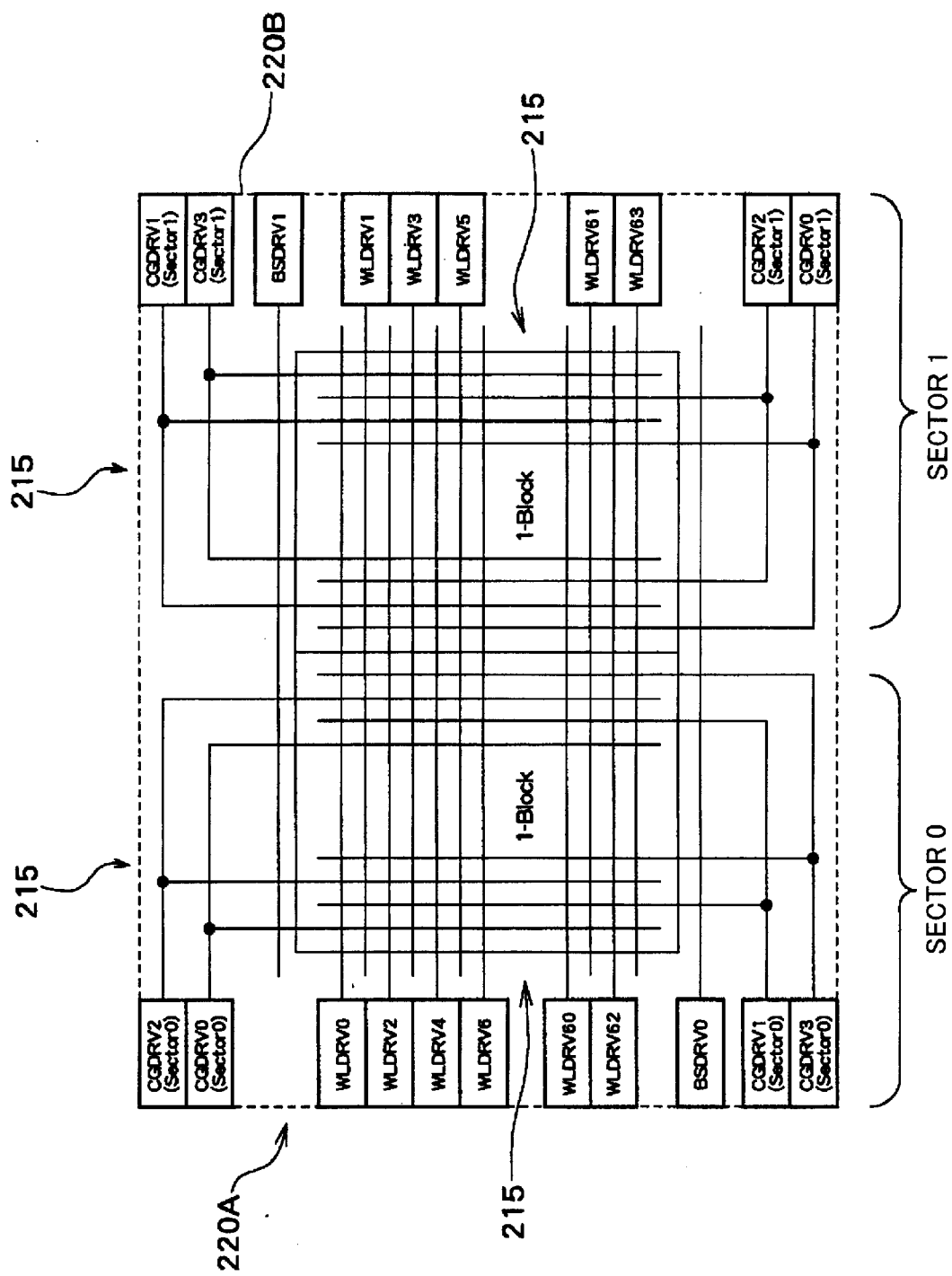
FIG. 6 is a schematic explanatory diagram showing the relationship between the two small blocks in two adjacent sectors and the local driver areas.

The two small blocks 215 in the two, 0th and first sector areas 210 adjacent to each other, and the local driver areas 220A, 220B on both the sides thereof are shown in detail in FIG. 6. As shown in FIG. 6, the four local control gate line drivers CGDRV 0 to CGDRV 3 shown in FIG. 5 are arranged in the left local driver area 220A. Likewise, the four local control gate line drivers CGDRV 0 to CGDRV 3 shown in FIG. 5 are arranged in the right local driver area 220B.

Besides, local word line drivers WLDRV 0, ..., WLDRV 62 which drive the even-numbered word lines WL 0, 2, ..., 62 in the sectors 0, 1, respectively, are arranged in the left local driver area 220A. Local word line drivers WLDRV 1, ..., WLDRV 63 which drive the odd-numbered word lines WL 1, 3, ..., 63 in the sectors 0, 1, respectively, are arranged in the right local driver area 220B.

Further, as shown in FIGS. 5 and 6, a local bit line driver BSDRV 1 which drives the bit line selection gates 217A connected to, for example, the odd-numbered sub bit lines SBL of the sectors 0, 1 is arranged in the right local driver area 220B. A local bit line driver BSDRV 0 which drives the bit line selection gates 217B connected to, for example, the even-numbered sub bit lines SBL of the sectors 0, 1 is arranged in the left local driver area 220A.

Drive Circuits of Sectors 0, 1

Figure 7:
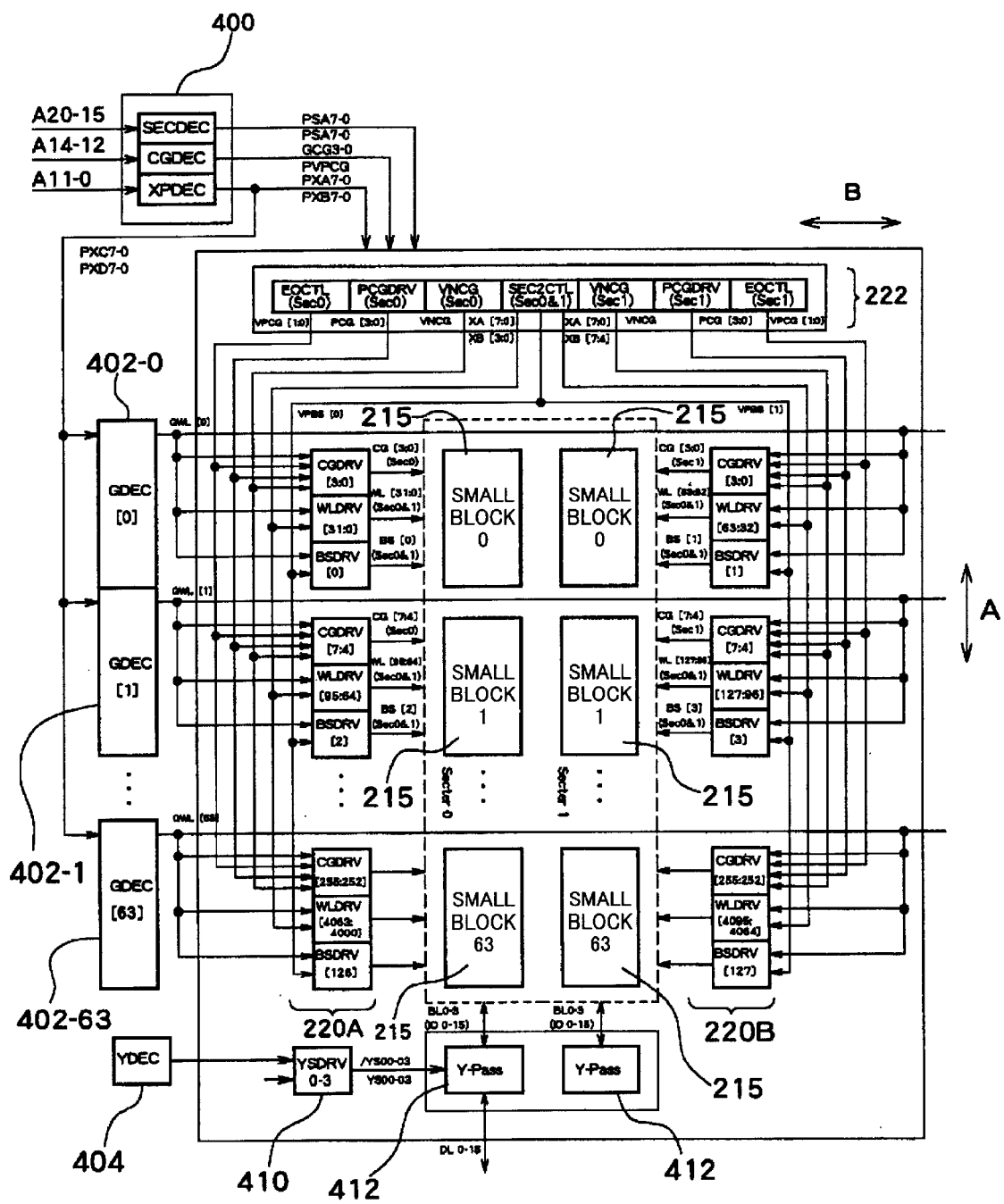
FIG. 7 is a block diagram showing the peripheral drive circuits of the two adjacent sectors.

Next, circuits which drive the memory cells in the respective small blocks 215 within the sectors 0, 1 will be described with reference to FIG. 7.

First, a predecoder 400, 64 global decoders 402-0 through 402-63, and a Y-decoder 404 are disposed as constituents which are shared by the sectors 0 to 63.

The predecoder 400 decodes an address signal A [20-0] which specifies a nonvolatile memory element to-be-selected (selected cell). The significances of the address signal A [20-0] will be indicated in Table 1 below.

TABLE 1

| ADDRESS  | GROUP       | FUNCTION        |                   |
|----------|-------------|-----------------|-------------------|
| A [20:15]| Sector      | Choose 1 of 64  |                   |
| A [14:12]| Row         | Choose 1 of 8   |                   |
| A [11:9] | Large block | Choose 1 of 8   | Choose 1 of 4096  |
| A [8:6]  | Small block | Choose 1 of 8   |                   |
| A [5:0]  | Column      | Choose 1 of 64  |                   |

As indicated in Table 1, one of the 64 sectors is selected by the higher-order address signal A [20-15], one bit in four cells (8 bits) within one small memory block 216 shown in FIG. 4 is selected by the medium-order address signal A [14-12], and one of the 4096 word lines WL in one sector is selected by the lower-order address signal A [11-0]. More specifically, one of the eight large blocks 212 existing in one sector is selected by the address signal A [11-9], one of the eight small blocks 215 existing in one large block 212 is selected by the address signal A [8-6], and one of the 64 word lines WL existing in one small block 215 is selected by the address signal A [5-0].

The 64 global decoders 402-0 through 402-63 render 64 global word lines GWL [0] to GWL [63] active on the basis of a result obtained by predecoding the lower-order address signal A[11-0] by means of the predecoder 400. Incidentally, only one global word line GWL is rendered active (Vdd) in each of a data reading mode and a data programming mode. All the 64 global word lines GWL are rendered active (Vdd) in a data erasing mode in a case where data in one sector are collectively erased. Thus, all the word lines WL in one sector are selected and are fed with a word line voltage for erasing.

The Y-decoder 404 drives a Y-pass circuit 412 through a Y-pass selection driver 410, whereby the selected bit line in the small block 215 is connected to a sense amplifier or a bit line driver at a succeeding stage.

As already described with reference to FIGS. 5 and 6, the local driver areas 220A, 220B are disposed on both the sides of the small blocks 215 in FIG. 7.

In the case of the small memory blocks 215-0 at the first row in the sectors 0, 1, there are arranged a control gate line driver CGDRV, namely, local CG drivers CGDRV 0 to CGDRV 3 which drive(s) the four main control gate lines MCG of the small block 215-0 at the first row in the sector 0, a local word line driver WLDRV [31-0] which drives the 31 even-numbered word lines WL in the sectors 0, 1, and a local bit line selection driver BSDRV [0] which drives the bit line selection transistors 217B connected to the even-numbered sub bit lines SBL in the sectors 0, 1, in the local driver area 220A on the left side of these blocks 215-0. In the local driver area 220B on the right side, there are arranged a control gate line driver CGDRV, namely, local CG drivers CGDRV 0 to CGDRV 3, which drive(s) the four main control gate lines MCG of the small block 215-0 at the first row in the sector 1, a word line driver WLDRV [63-32] which drives the 31 odd-numbered word lines WL in the sectors 0, 1, and a local bit line selection driver BSDRV [1] which drives the bit line selection transistors 217A connected to the odd-numbered sub bit lines SBL in the sectors 0, 1.

Next, the sector control circuit 222 arranged, for example, on the upper sides of the sectors 0, 1 will be described in detail with reference to FIG. 7.

Two control-gate-voltage control circuits EOCTL which are disposed in correspondence with the sectors 0, 1, respectively, output two sorts of high voltages VPCG [1:0] for the control gates, each of which is set at either potential VP1 or VP2, on the basis of a predecoded output from the predecoder 400. That is, when one high voltage VPCG [0] for the control gates is the potential VP1, the other high voltage VPCG [1] for the control gates becomes the potential VP2.

Figure 23:
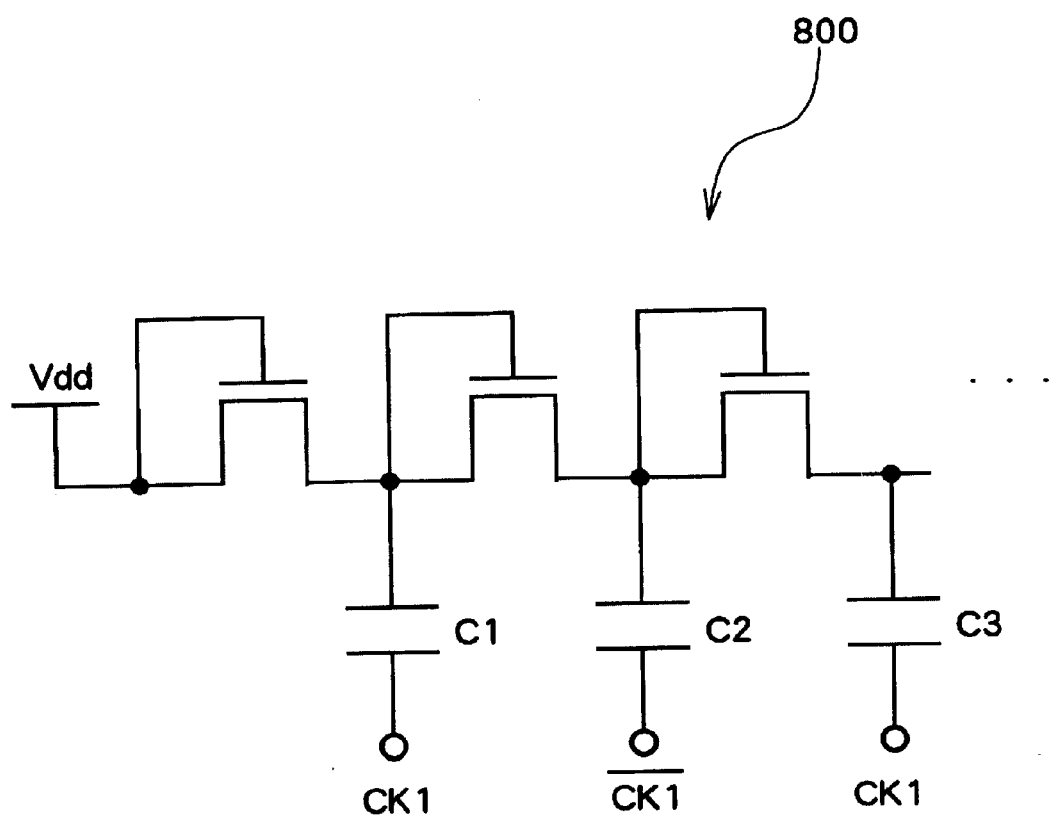
FIG. 23 is an equivalent circuit diagram showing an example of a booster circuit shown in FIG. 11.

Here, the voltages VP1, VP2 are generated by a booster circuit (charge pump) 800 as shown in FIG. 23, and they are set at boosted voltages which differ depending upon the operation modes. By way of example, VP1=1.5V and VP2= 3V hold in the data reading mode. On the other hand, VP1=5.5V and VP2=2.5V hold in the data programming mode.

Figure 8:
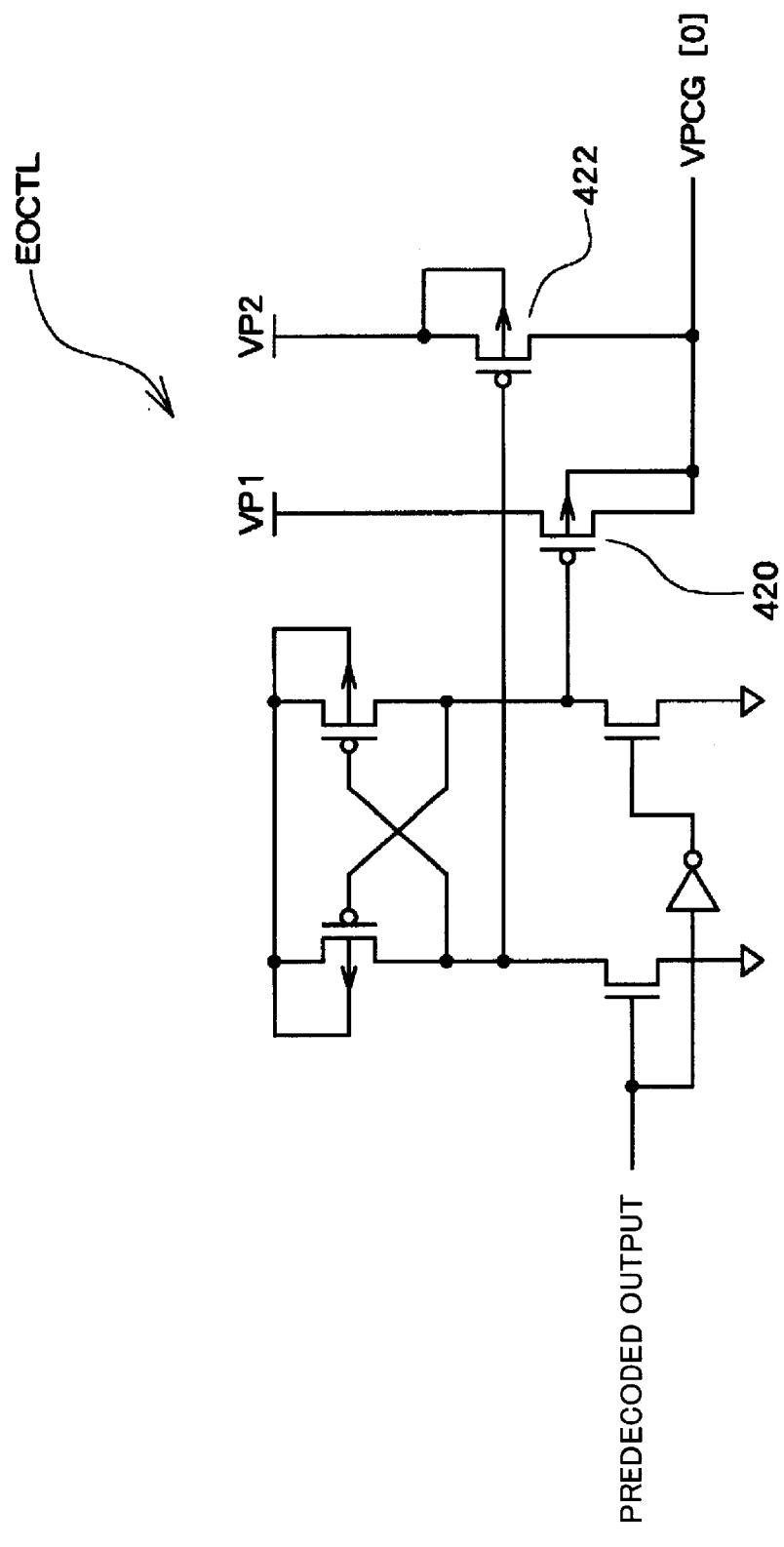
FIG. 8 is a circuit diagram showing an example of a control-gate-voltage control circuit EOCTL shown in FIG. 7.

FIG. 8 shows an example of a circuit which outputs the high voltage VPCG [0] for the control gates, in the control-gate-voltage control circuit EOCTL. Referring to FIG. 8, when the predecoded output is HIGH, a P-type MOS transistor 420 turns OFF, and a P-type MOS transistor 422 turns ON, so that the voltage VP2 is outputted as the high voltage VPCG [0] for the control gates. To the contrary, when the predecoded output is LOW, the P-type MOS transistor 420 turns ON, and the P-type MOS transistor 422 turns OFF, so that the voltage VP1 is outputted as the high voltage VPCG [0] for the control gates.

Two precontrol gate line drivers PCGDRV which are disposed in correspondence with the sectors 0, 1, respectively, output driver selection signals PCG [3:0] each of which renders active any of the four local control gate line drivers CGDRV 0 to CGDRV 3 disposed in correspondence with the small blocks 215 in the corresponding sector 0 or 1, on the basis of the predecoded output from the predecoder 400.

Figure 9:
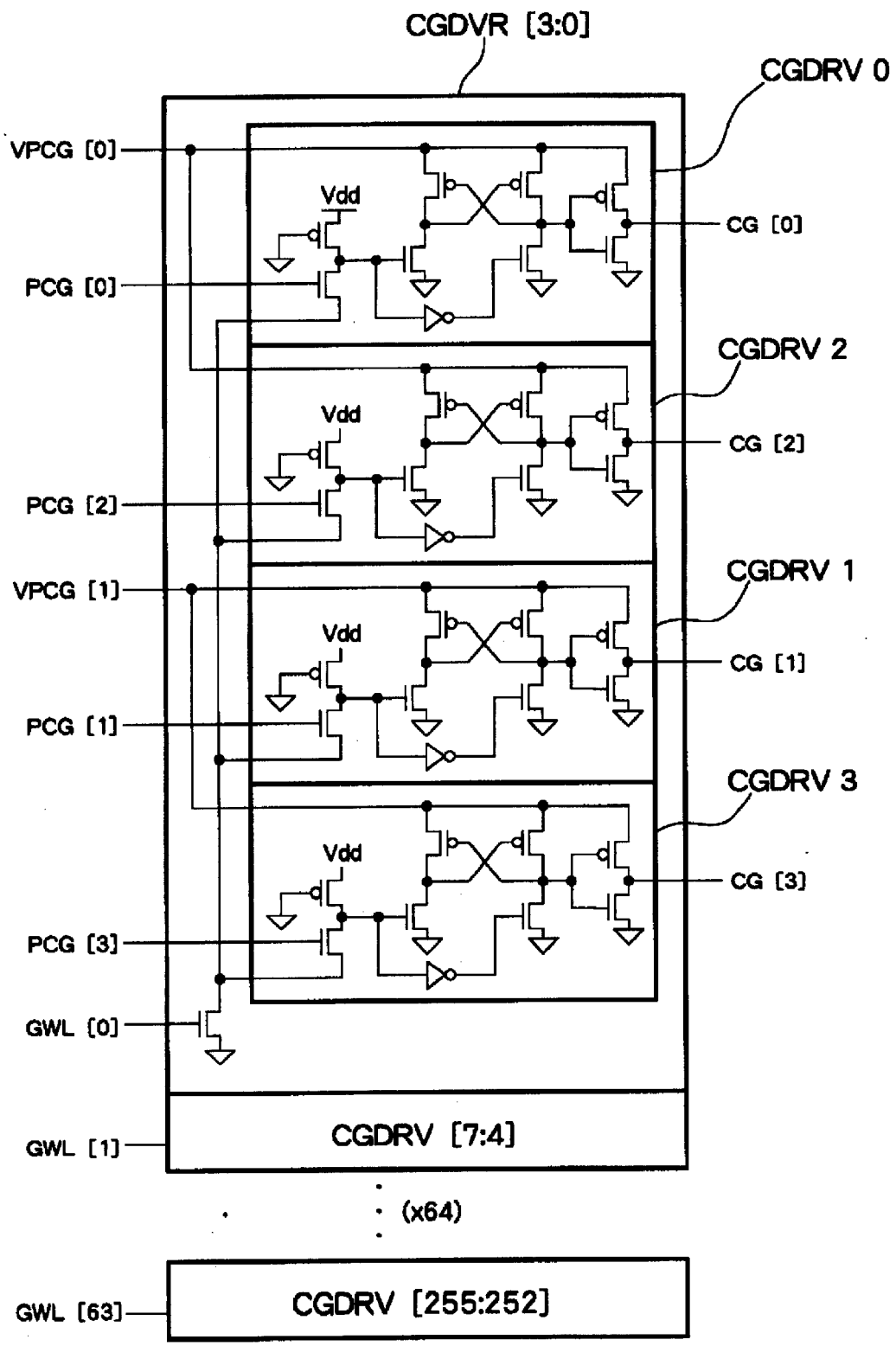
FIG. 9 is a circuit diagram showing an example of a control gate line driver CGDRV shown in FIG. 7.

Here, local control gate line drivers CGDRV [3:0] to CGDRV [255:252] disposed in correspondence with the small blocks 0 to 63 in the sector 0 are shown in FIG. 9.

Referring to FIG. 9, the high voltage VPCG [0] for the control gates are inputted to the local control gate line drivers CGDRV 0, 2, while the high voltage VPCG [1] for the control gates are inputted to the local control gate line drivers CGDRV 1, 3.

Besides, driver selection signals PCG [3:0] are respectively inputted to the corresponding control gate line drivers CGDRV 0 to CGDRV 3.

In the case of the local control gate line driver CGDRV 0, only when the global word line signal GWL [0] is HIGH and where the driver selection signal PCG [0] is HIGH, the high voltage VPCG [0] for the control gates, being the voltage VP1 or VP2, is outputted from the local control gate line driver CGDRV 0. In any other case, the output of the local control gate line driver CGDRV 0 becomes 0V. This operation is also true of the other control gate line drivers.

Two negative voltage supply circuits VNCG for precontrol gates as are disposed in correspondence with the sectors 0, 1, respectively, feed a negative voltage VNCG (for example, −3V) to be applied to the control gates in the data erasing mode, to the four local control gate line drivers CGDRV 0 to CGDRV 3 disposed in correspondence with the small blocks 215 in the corresponding sector 0 or 1, on the basis of the predecoded output from the predecoder 400.

Although a circuit which feeds the negative voltage VNCG in the data erasing mode is omitted from FIG. 9, it feeds the negative voltage VNCG to the control gates in all the small blocks 215 within the corresponding sector in the data erasing mode, whereby data can be collectively erased every sector.

A 2-sector control circuit SEC2CTL which is disposed in common for the sectors 0, 1, outputs signals XA [7:0], XB [3:0] and XB [7:4] for selecting the word line drivers WLDRV disposed in correspondence with the respective small blocks 215 within the sectors 0, 1, and further outputs a voltage VPBS [1:0] for driving the local bit line selection drivers BSDRV.

Here, the "signal XA [7:0] for selecting the word line drivers" corresponds to the address signal A [2:0], and it selects by a signal of 8 bits, one word line driver WLDRV in those pair of small blocks 215 of the sectors 0, 1 by which the word line is shared. On the other hand, the "selection signal XB [7:0]" corresponds to the address signal A [5:3]. In this regard, eight word line drivers WLDRV connected to each even-numbered word line WL are selected from among the 64 word line drivers WLDRV [63-0] corresponding to one small block 215, by the selection signal XB [3:0] of 4 bits. Also, eight word line drivers WLDRV connected to each odd-numbered word line WL are selected from among the 64 word line drivers WLDRV [63-0] corresponding to one small block 215, by the other selection signal XB [7:4] of 4 bits.

Figure 10:
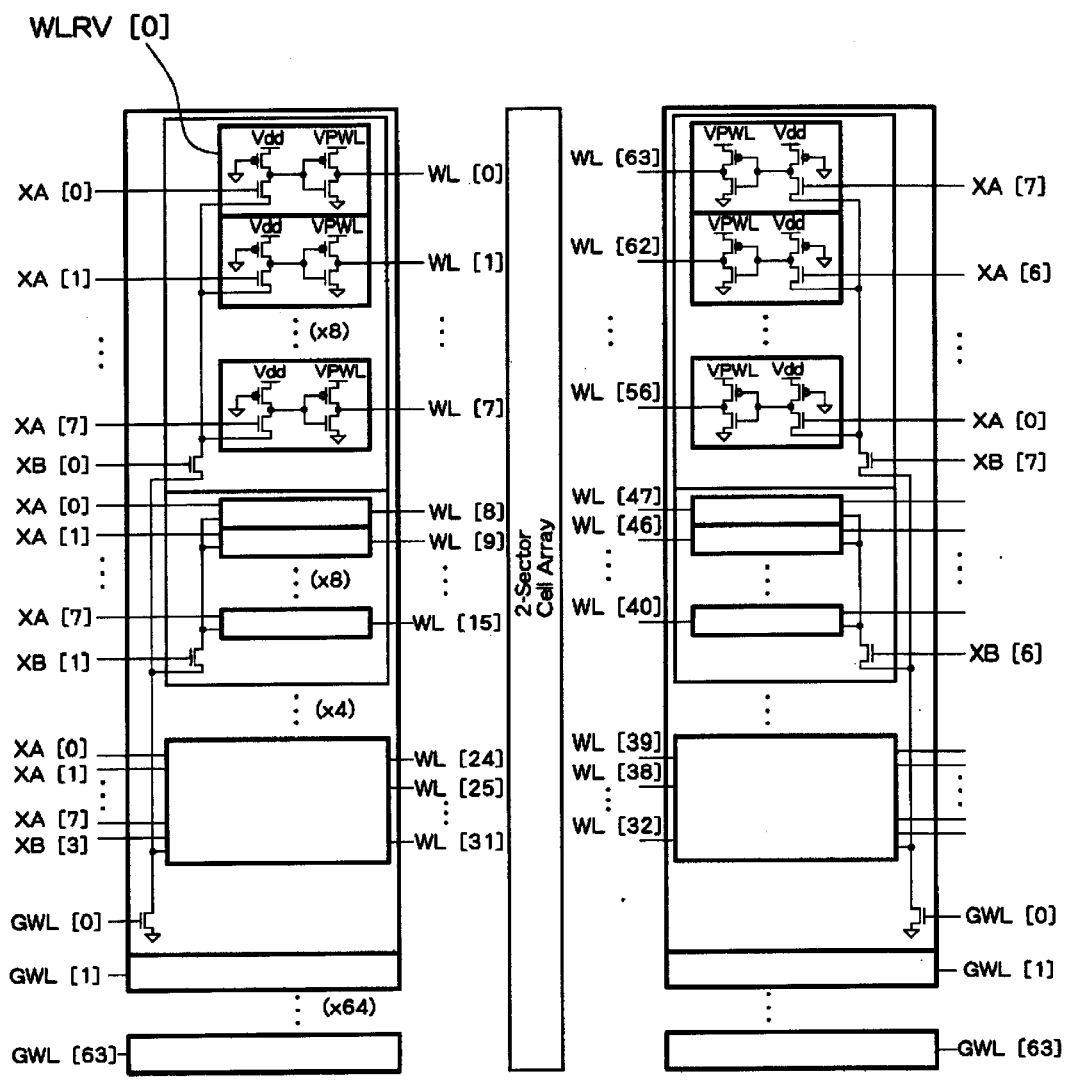
FIG. 10 is a circuit diagram showing an example of a word line driver WLDRV shown in FIG. 7.

In the case of the word line driver WLDRV [0] shown in FIG. 10, a potential VPWL is supplied to the word line WL [0] when all the signals GWL [0], XA [0] and XB [0] have become active, and a ground potential is supplied at any other time. The potential VPWL becomes a write potential in writing data, and becomes a read potential in reading data.

Next, there will be explained the bit line selecting high voltage VPBS [1:0] which is outputted from the 2-sector control circuit SEC2CTL.

Figure 11:
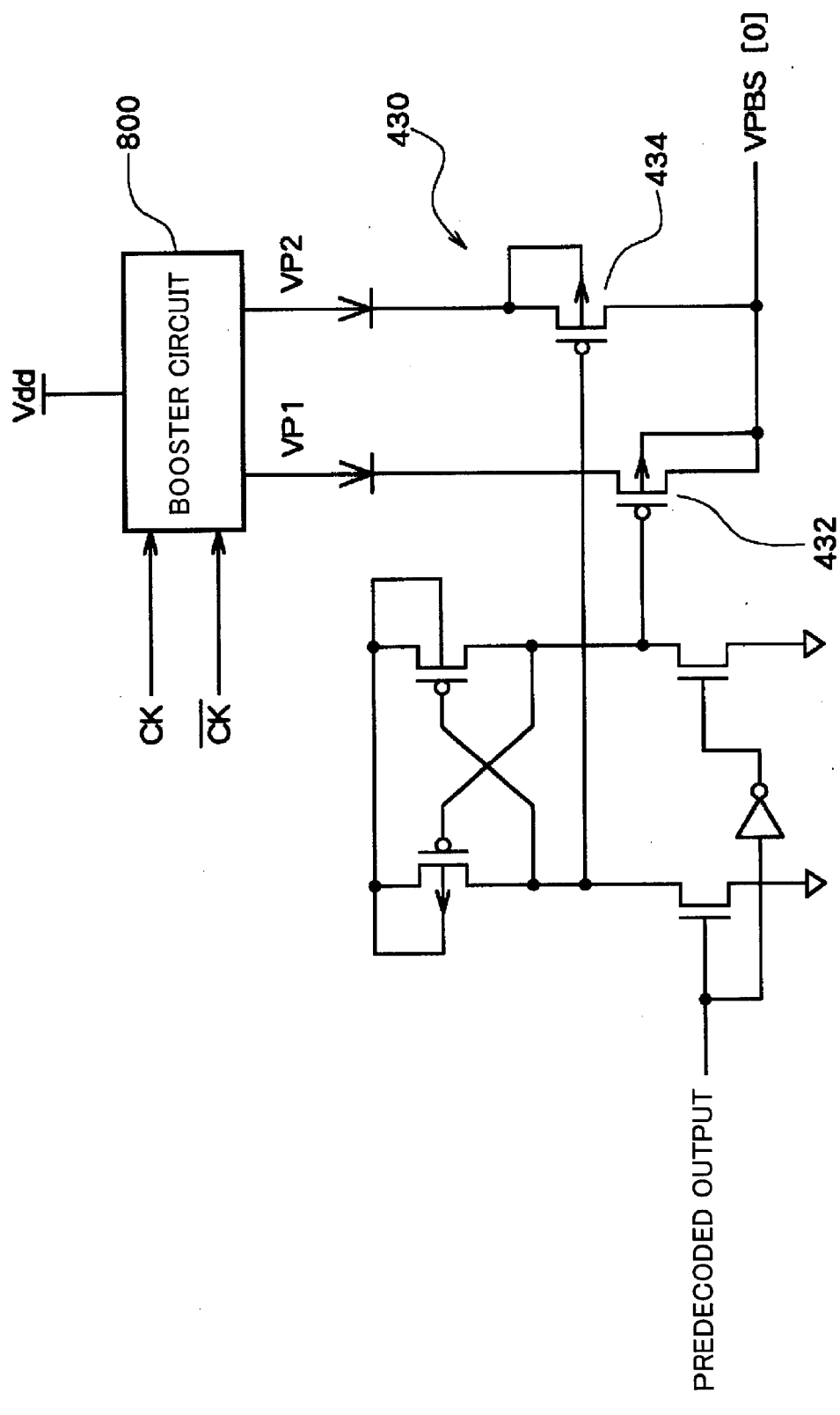
FIG. 11 is a circuit diagram showing an example of a bit-line-selection-voltage control circuit 430 which is included in a 2-sector control circuit SEC2CTL shown in FIG. 7.

As shown in FIG. 11, the 2-sector control circuit SEC2CTL includes a bit-line-selection voltage control circuit 430 which is constructed similarly to the control-gate-voltage control circuit EOCTL shown in FIG. 8.

FIG. 11 shows an example of the bit-line-selection voltage control circuit 430 which outputs the bit line selecting high voltage VPBS [0]. Referring to FIG. 11, when the predecoded output is HIGH, a P-type MOS transistor 432 turns OFF, and a P-type MOS transistor 434 turns ON, so that the voltage VP2 is outputted as the bit line selecting high voltage VPBS [0]. To the contrary, when the predecoded output is LOW, the P-type MOS transistor 432 turns ON, and the P-type MOS transistor 434 turns OFF, so that the voltage VP1 is outputted as the bit line selecting high voltage VPBS [0].

Incidentally, these voltages VP1, VP2 are also generated in correspondence with the respective modes by the booster circuit 800 stated before. More specifically, VP1=Vdd (1.8V) and VP2=4.5V, for example, hold in the data reading mode, and VP1=VP2=8V, for example, holds in the data programming mode and the data erasing mode. The voltages VP1 and VP2 are generated on the basis of clocks CK, /CK and the supply voltage Vdd which are inputted to the booster circuit 800.

Figure 12:
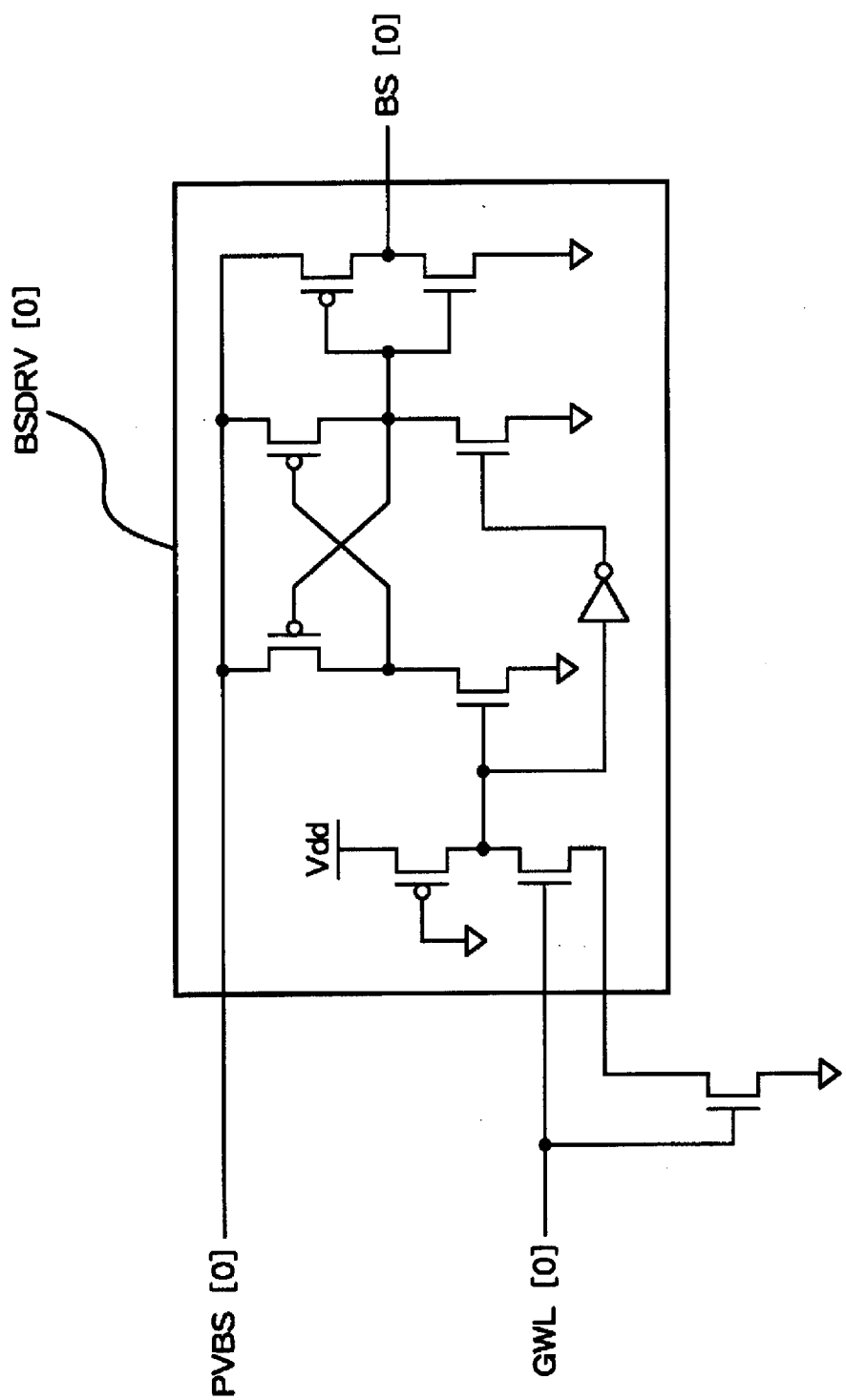
FIG. 12 is a circuit diagram showing an example of a bit line driver BSDRV [0] shown in FIG. 7.

Here, the local bit line selection driver BSDRV [0] disposed in correspondence with the small block 0 in the sector 0 is shown in FIG. 12.

Referring to FIG. 12, the bit line selecting high voltage VPBS [0] and the global word line signal GWL [0] are inputted to the local bit line selection driver BSDRV [0]. On condition that the global word line signal GWL [0] is HIGH, the bit line selecting high voltage VPBS [0] of the voltage VP1 or VP2 is outputted from the local bit line selection driver BSDRV [0]. In any other case, the output of the local bit line selection driver BSDRV [0] becomes 0V. This operation is also true of the other local bit line selection drivers.

Description of Operations

Here will be described the operations of reading data, programming data and erasing data in the nonvolatile semiconductor storage device of this embodiment.

A selected block in the reading mode or the programming mode includes therein a selected memory cell 100, and unselected memory cells 100. Further, the selected memory cell includes therein the memory element 108A or 108B of a selected cell, and the memory element 108B or 108A of an opposite cell.

Under the definitions given above, the potentials of the control gate line CG, bit line BL and word line WL in the reading mode, programming mode and erasing mode will be indicated in Table 2 below.

example, 1.8V) is applied as a reading word line selection voltage to the word gate WL1 which lies at the same row as that of the memory cell 100 [i], thereby to turn ON the transistors T2 of that row. Besides, an override voltage (VP2 in FIG. 8=3V by way of example) is applied through the sub control gate line SCG [i] to the left control gate 106A (the opposite cell) of the memory cell 100 [i], thereby to turn ON the transistor T1 corresponding to the MONOS memory element 108A. A read voltage Vread (VP1 in FIG. 8=1.5 V by way of example) is applied as the voltage VCG of the right control gate 106B of the memory cell 100 [i].

On this occasion, the operation of the transistor T3 corresponding to the MONOS memory element 108B is divided as stated below, depending upon whether or not

TABLE 1

| | | | Selected Block | | | | | | |
|---|---|---|---|---|---|---|---|---|---|
| | | | Selected MONOS CELL | | | | | | |
| | | | Selected Cell | | Opposited Cell | | Unselected MONOS Cell | | |
| Mode | BS | WL | BL | CG | BL | CG | WL | BL | CG |
| Read | 4.5 V (Opp.Side) Vdd (SelSide) | Vdd | 0 V | 1.5 V ± 0.1 V | sense | 3 V | Vdd or 0 V | sense or 0 V | 3v or 1.5 V ± 0.1 V or 0 V |
| Program | 8 V | Approx. 1 V | 5 V | 5.5 V | Iprg = 5 uA (0 to 1 V) | 2.5 V | Approx.1 V or 0 V | 5 V or Vdd or (0 to 1 V) | 5.5 V or 2.5 V or 0 V |
| Erase | 8 V | 0 V | 4.5 to 5 V | −1 to −3 V | 4.5 to 5 V | −1 to −3 V | | | |

Now, the operations of the respective modes will be described in conjunction with Table 2.

Data Readout From Memory Cell

Figure 13:
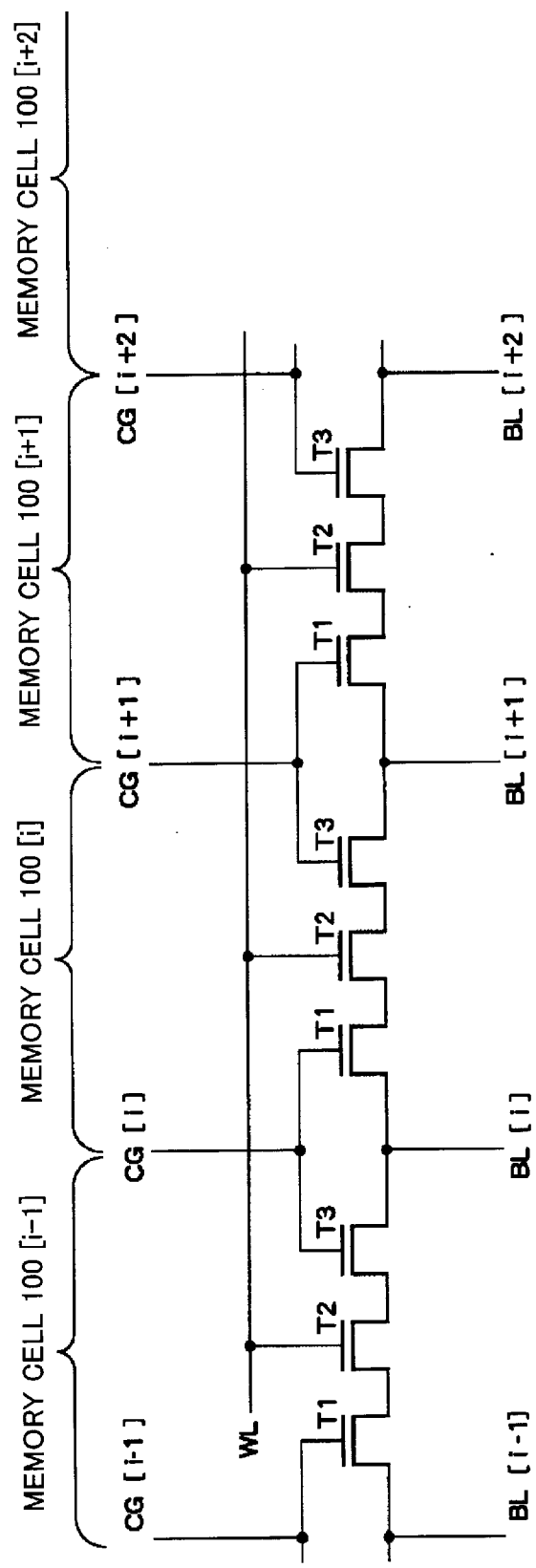
FIG. 13 is an equivalent circuit diagram of the memory cells shown in FIG. 1.

As shown in FIG. 13, one memory cell 100 can be modeled as a series connection consisting of a transistor T2 which is driven by the word line WL, and transistors T1, T3 which are respectively driven by the first and second control gates 106A, 106B.

Figure 14:
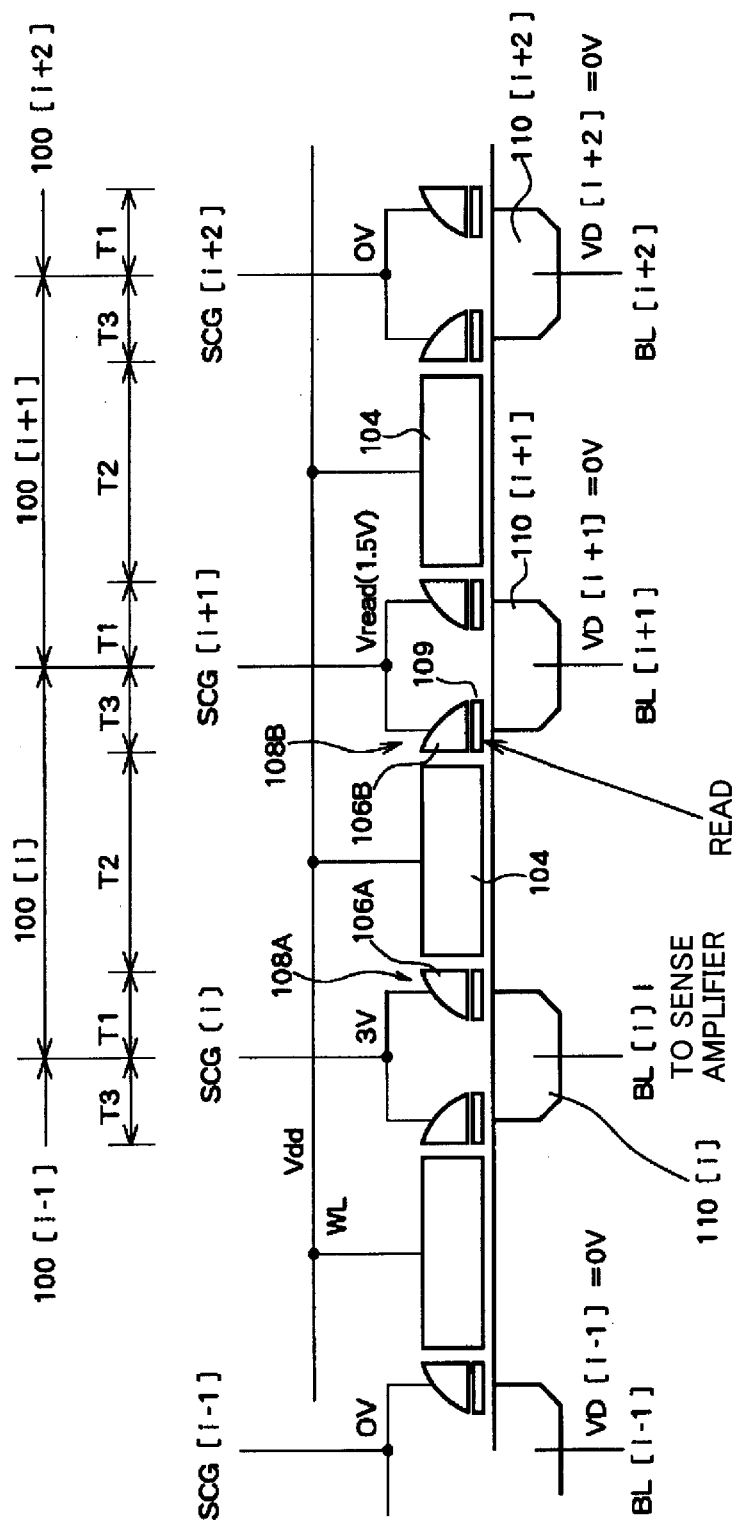
FIG. 14 is a schematic explanatory diagram for explaining a data reading operation in the nonvolatile semiconductor storage device shown in FIG. 1.
Figure 15:
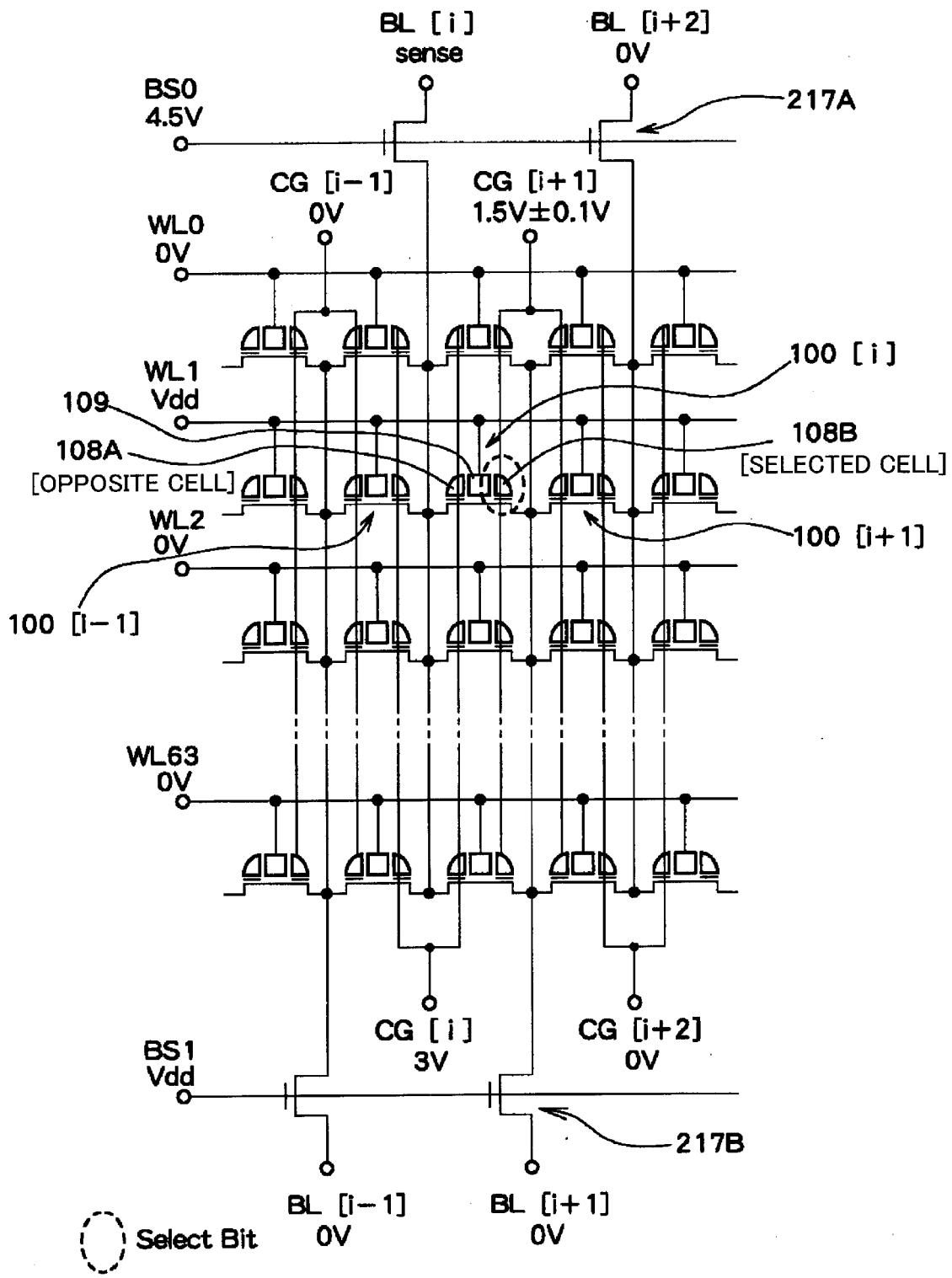
FIG. 15 is a schematic explanatory diagram for explaining the settings of voltages within the selected block in the data reading mode.

In describing the operation of the memory cell 100, there will be first explained the settings of the potentials of the various positions of the four memory cells 100 [i−1], [i], [i+1], [i+2] which are adjacent to one another in a certain selected block (selected small block 215) within, for example, the sector 0 as shown in FIG. 14. FIG. 14 is a diagram for explaining a case where data is read out in a reverse reading mode from the MONOS memory element 108B (selected cell) on the right side of that word gate 104 of the memory cell 100 [i] which is connected to the word line WL, while FIG. 15 shows the settings of voltages in the selected block on that occasion.

Here, the "reverse read" reads data by sensing current which flows through the bit line BL [i], by employing as a source the bit line BL [i+1] which is connected to the right selected cell 108B of the memory cell 100 [i], and as a drain the bit line BL [i] which is connected to the opposite cell 108A of the memory cell 100 [i].

Incidentally, the present invention can be applied also to forward read. In case of the forward read, data is read by sensing current which flows through the bit line BL [i+1], by employing as a drain the bit line BL [i+1] which is connected to the right selected cell 108B of the memory cell 100 [i], and as a source the bit line BL [i] which is connected to the opposite cell 108A of the memory cell 100 [i].

The read operation will be described below by taking the reverse read as an example. In this case, the voltage Vdd (for charges are stored in the right MONOS memory element 108B (selected cell) of the word gate 104.

Figure 16:
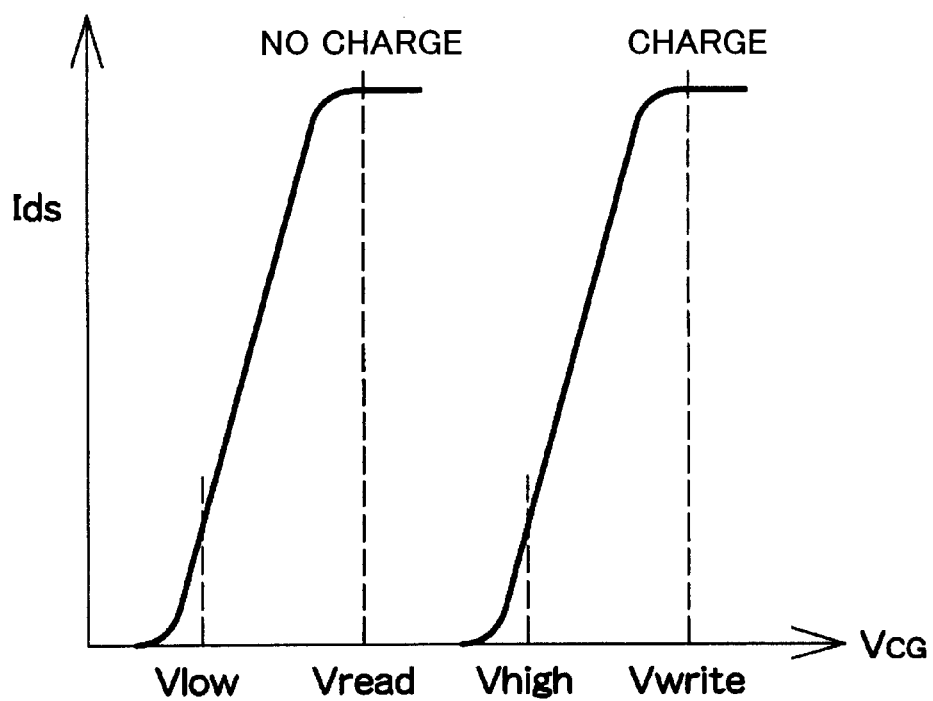
FIG. 16 is a characteristic diagram showing the relationships between a control gate voltage VCG and a source—drain current Ids in the memory cells shown in FIG. 1.

FIG. 16 shows the relationships between the applied voltage to the right control gate (the selected cell side) 106B of the memory cell 100 [i] and the current Ids flowing through the source drain path of the transistor T3 corresponding to the MONOS memory element 108B (selected cell) which is controlled by the control gate 106B.

As shown in FIG. 16, in a case where no charges are stored in the MONOS memory element 108B (selected cell), the current Ids begins to flow when the control gate voltage VCG exceeds a low threshold voltage Vlow. In contrast, in a case where charges are stored in the MONOS memory element 108B (selected cell), the current Ids does not begin to flow unless the control gate potential VCG of the selected side exceeds a high threshold voltage Vhigh.

Here, the voltage Vread which is applied to the control gate 106B of the selected side in the data reading mode is set at substantially the middle voltage between the two threshold voltages Vlow and Vhigh.

Accordingly, the current Ids flows in the case where no charges are stored in the MONOS memory element 108B (selected cell), and it does not flow in the case where the charges are stored in the MONOS memory element 108B (selected cell).

Here, as shown in FIG. 15, in the data reading mode, the bit line BL [i] (impurity layer 110[i]) connected to the opposite cell is connected to the sense amplifier, and the potentials VD [i−1], [i+1], [i+2] of the other bit lines BL [i−1], [i+1], [i+2] are respectively set at 0V. Thus, since the current Ids flows in the absence of the charges in the MONOS memory element 108B (selected cell), a current of, for example, at least 25 μA flows to the bit line BL [i] of the opposite side through the transistors T1, T2 in the ON states. In contrast, since the current Ids does not flow in the presence of the charges in the MONOS memory element 108B (selected cell), a current which flows to the bit line BL [i] connected to the opposite cell becomes less than, for example, 10 nA in spite of the ON states of the transistors T1, T2. Therefore, data can be read out of the MONOS memory element 108B (selected cell) of the memory cell 100 [i] in such a way that the current flowing to the bit line BL [i] of the opposite side is detected by the sense amplifier.

In this embodiment, as shown in FIG. 15, the bit line selection transistors (N-type MOS transistors) 217A are respectively connected to the bit lines BL [i], [i+2], and the bit line selection transistors 217B to the bit lines BL [i−1], [i+1].

Each of these selection transistors 217A, 217B is difficult of holding its current drivability high, in relation to its size, and it has, for example, a channel width W=0.9 μm and a channel length L=0.8 μm in this embodiment.

Since the above current needs to be ensured for the bit line BL [i] connected to the sense amplifier, the gate voltage BS0 of the bit line selection transistor 217A is set at a high voltage of, for example, 4.5V (=VP2) by the circuit shown in FIG. 11.

On the other hand, the voltage of the source side of the MONOS memory element 108A of the selected side in FIG. 15 becomes a voltage close to 0V (on the order of several tens to several hundred mV). Consequently, the back gate of the bit line selection transistor 217B exerts little influence, and hence, the gate voltage BS1 thereof is set at the voltage Vdd (=VP1) by a circuit similar to the circuit in FIG. 11. Since this gate need not be fed with the voltage of 4.5V, the load of the unshown booster circuit (charge pump) for generating the voltage of 4.5V can be lightened.

Incidentally, assuming that the selected cell be the left nonvolatile memory element 108A of the memory cell 100 [i] in FIG. 15, the bit line BL [i] serves as a source in the reverse read, and the bit line BL [i+1] connected to the opposite cell 108B serves as a drain connected to the sense amplifier. In this case, therefore, the gate voltage BS0 of the bit line selection transistor 217A may be set at the voltage Vdd, and the gate voltage BS1 of the bit line selection transistor 217B at 4.5V.

Incidentally, regarding the unselected cell in the selected block, voltages are set as listed in Table 2.

Programming of Memory Cell

Figure 17:
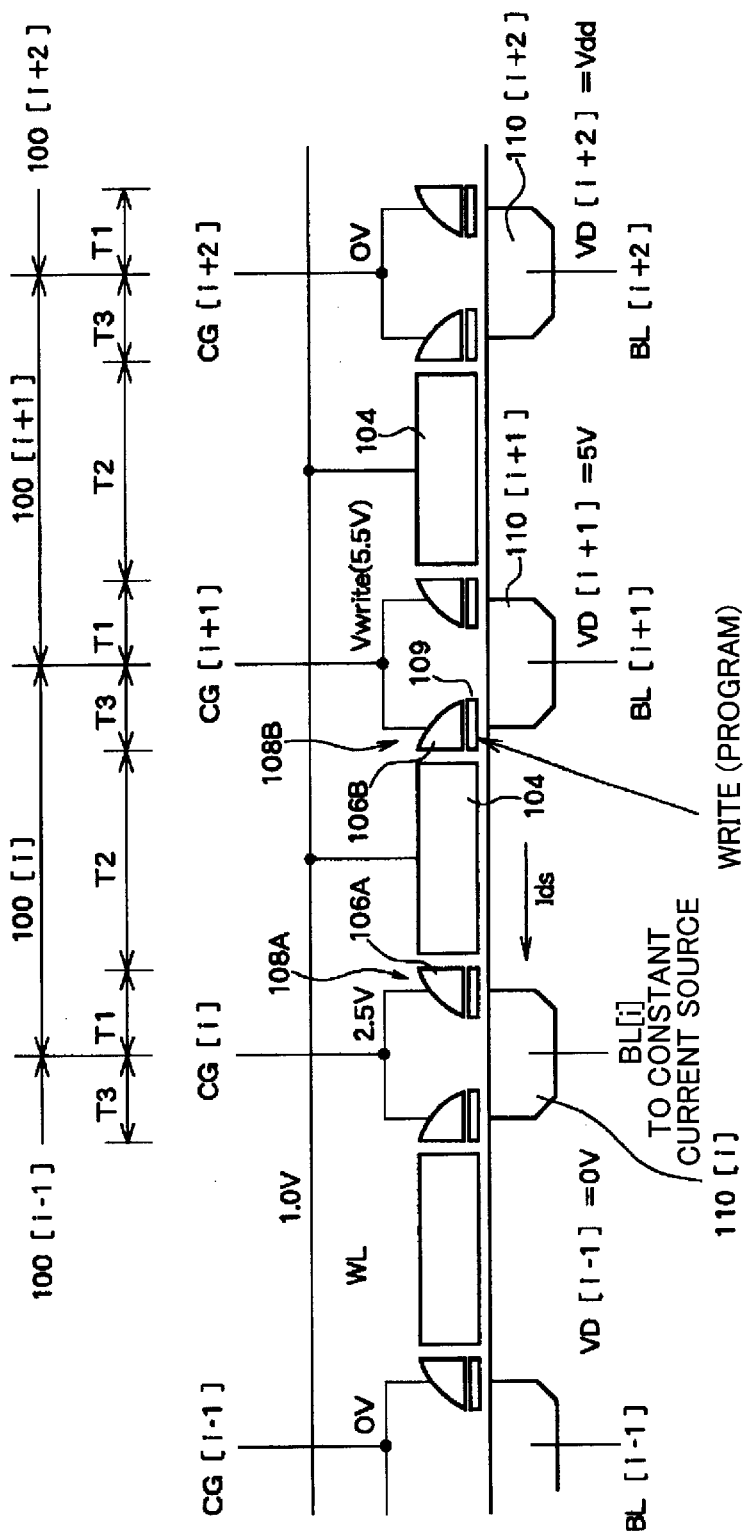
FIG. 17 is a schematic explanatory diagram for explaining a data writing (programming) operation in the nonvolatile semiconductor storage device shown in FIG. 1.
Figure 18:
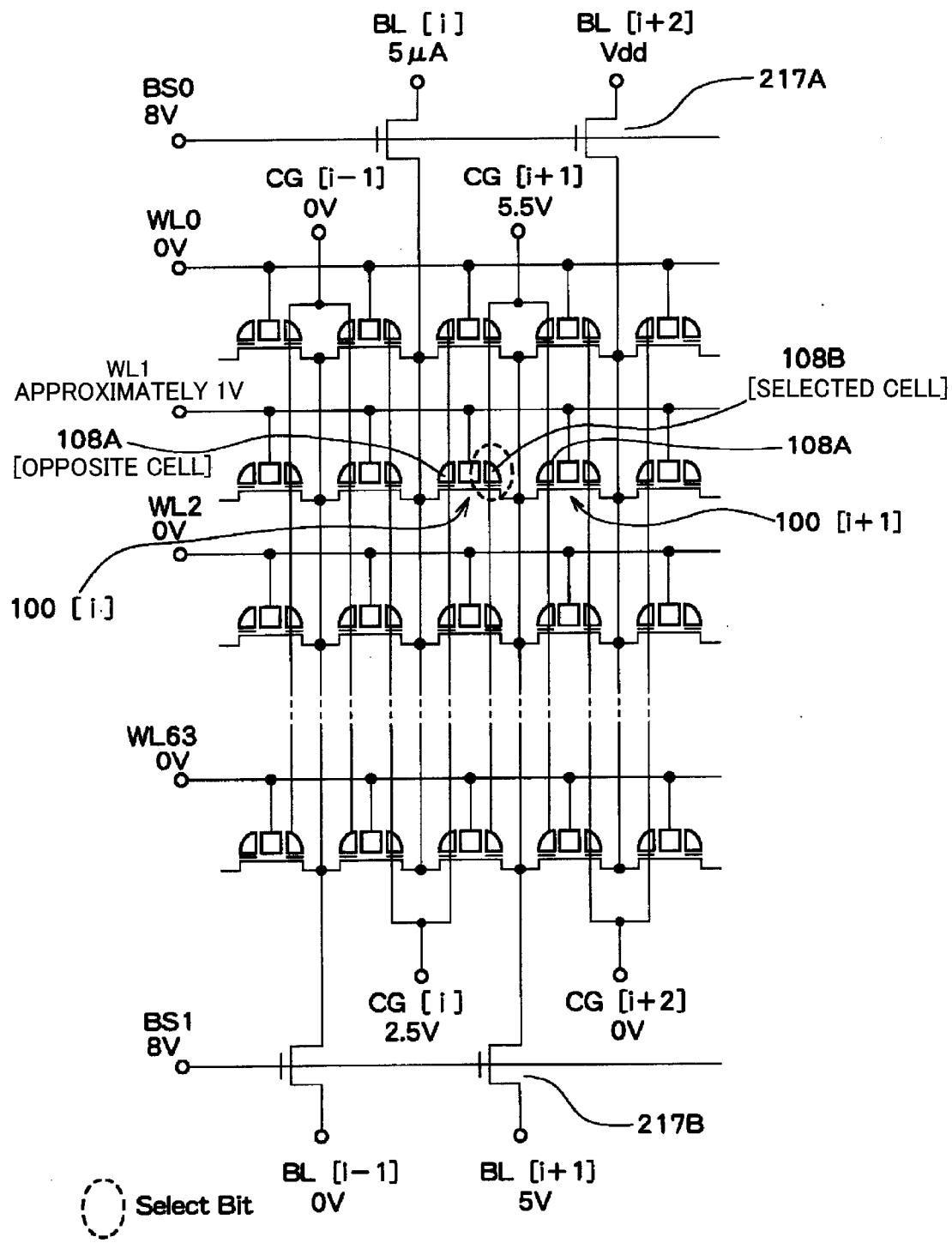
FIG. 18 is a schematic explanatory diagram for explaining the settings of voltages within the selected block in the data programming mode.

FIG. 17 is a diagram for explaining the data programming of the MONOS memory element 108B (selected cell) on the right side of the word gate 104 of the memory cell 100 [i] connected to the word line WL1, while FIG. 18 shows the situation of the settings of voltages in the selected block. The data programming operation is preceded by a data erasing operation which will be stated later.

In FIG. 17, as in FIG. 14, the potential of the sub control gate line SCG [i] is set at the override potential (VP1 in FIG. 8=2.5V by way of example), and the potentials of the sub control gate lines SCG [i−1], [i+2] are set at 0V. Here, the "override potential" is a potential which is required for causing a program current to flow by turning ON the transistor T1 correspondent to the left MONOS memory element 108A (opposite cell opposing to the selected cell) of the memory cell 100 [i], irrespective of whether or not the MONOS memory element 108A is to be programmed. Besides, the potentials of the word gates 104 in FIG. 17 are set at a programming word line selection voltage of, for example, about 1.0V lower than the supply voltage Vdd by the word line WL1. Further, the potential of the right control gate 108B (selected cell) of the memory cell 100 [i+1] is set at a write voltage Vwrite (VP2 in FIG. 8=5.5V by way of example) being a programming control gate voltage and shown in FIG. 4, through the sub control gate line SCG [i+1].

Figure 19:
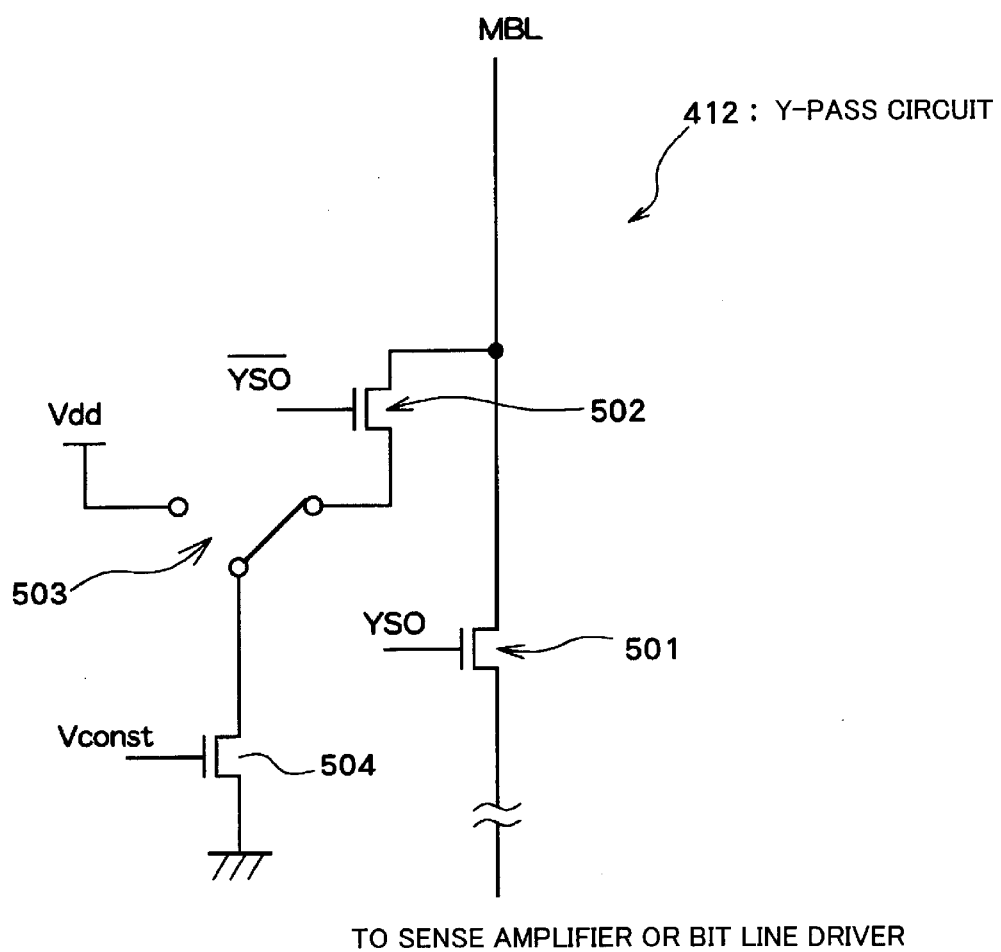
FIG. 19 is a circuit diagram schematically showing a Y-pass circuit which is connected to a bit line.

Next, the settings of the voltages of the bit line BL will be described with reference to FIG. 19. FIG. 19 schematically shows the interior of the Y-pass circuit 412 which is connected to the main bit line MBL.

Disposed in the Y-pass circuit 412 are a first transistor 501 for connecting the main bit line MBL to the sense amplifier or the bit line driver, and a second transistor 502 for connecting the same to any other path. Complementary signals YS0 and /YS0 are respectively inputted to the gates of the first and second transistors 501 and 502.

The node of the supply voltage Vdd (1.8V), and a constant current source 504 for causing a constant current of, for example, 5 μA are disposed for the source of the second transistor 502 through a switch 503.

In the programming mode, the voltage VD [i+1] of the bit line BL [i+1] in FIGS. 17 and 18 is connected to the bit line driver through the first transistor 501 in FIG. 19 and is set at, for example, 5V being a programming bit line voltage.

Besides, the bit line BL [i+2] is set at the voltage Vdd through the second transistor 502 and the switch 503 in FIG. 19.

Both the bit lines BL [i−1], [i] are connected to the constant current source 504 through the second transistor 502 and the switch 503 in FIG. 19. However, the MONOS cell connected to the bit line BL [i−1] turns OFF because of the 0V of its control gate line CG [i−1], and no current flows therethrough, so that it is set at 0V through the constant current source 504.

Thus, the transistors T1, T2 of the memory cell 100 [i] turn ON, respectively, and the current Ids flows toward the bit line BL [i], while at the same time, channel hot electrons (CHE) are trapped into the ONO film 109 of the MONOS memory element 108B. In this way, the programming operation of the MONOS memory element 108B is performed to write data "0".

On this occasion, there is also a method in which the programming word line selection voltage is set at 0.77V or so, not at about 1V, so as to bring the bit line BL [i] to 0V. In this embodiment, although the source—drain current is increased by raising the programming word line selection voltage to about 1V, the current which flows into the bit line BL [i] in the programming mode is limited by the constant current source 504. Therefore, the voltage of the bit line BL [i] can be set at the optimum value (within a range of 0–1 V, and about 0.7V in this embodiment), and the programming operation can be optimally performed.

On account of the above operation, the voltage of 5.5V is applied also to the control gate of the right nonvolatile memory element 108A of the unselected memory cell 100 [i+1]. On this occasion, the right control gate CG [i+2] of the memory cell 100 [i+1] is set at 0V, so that any current does not essentially flow between the source and drain (between the bit lines) of the memory cell 100 [i+1]. Since, however, the voltage of 5V is applied to the bit line BL [i+1], any high electric field exerted between the source and drain (between the bit lines) of the memory cell 100 [i+1] causes a punch-through current to flow and gives rise to a write disturbance. Therefore, the write disturbance is prevented by setting the voltage of the bit line BL [i+2] at, for example, Vdd, not at 0V, and lessening the potential difference between the source and drain. Moreover, the voltage of the bit line BL [i+2] is set at the voltage which exceeds 0V, and which is preferably, at least, equal to the word line selection voltage in the programming mode, whereby the transistor T2 of the memory cell [i+1] becomes difficult to turn ON. The disturbance can be prevented also by this fact.

Besides, since the voltage of 5V needs to be fed to the bit line BL [i+1], the voltage VP1=VP2=8V is applied to the gate of the bit line selection transistor 217B by a circuit similar to that shown in FIG. 11. On the other hand, the voltage of 8V (VP1=VP2=8V in FIG. 11) is similarly applied to the gate of the bit line selection transistor 217A. Since the bit line BL [i+2] needs to be set at Vdd for the above reason, a voltage higher than Vdd needs to be applied also to the gate of the transistor 217A, and hence, the same voltage of 8V as the gate voltage of the transistor 217B is used. The gate voltage of the bit line selection transistor 217A may be higher than (Vdd+Vth).

Incidentally, regarding the unselected cell in the selected block, voltages are set as listed in Table 2.

Figure 20:
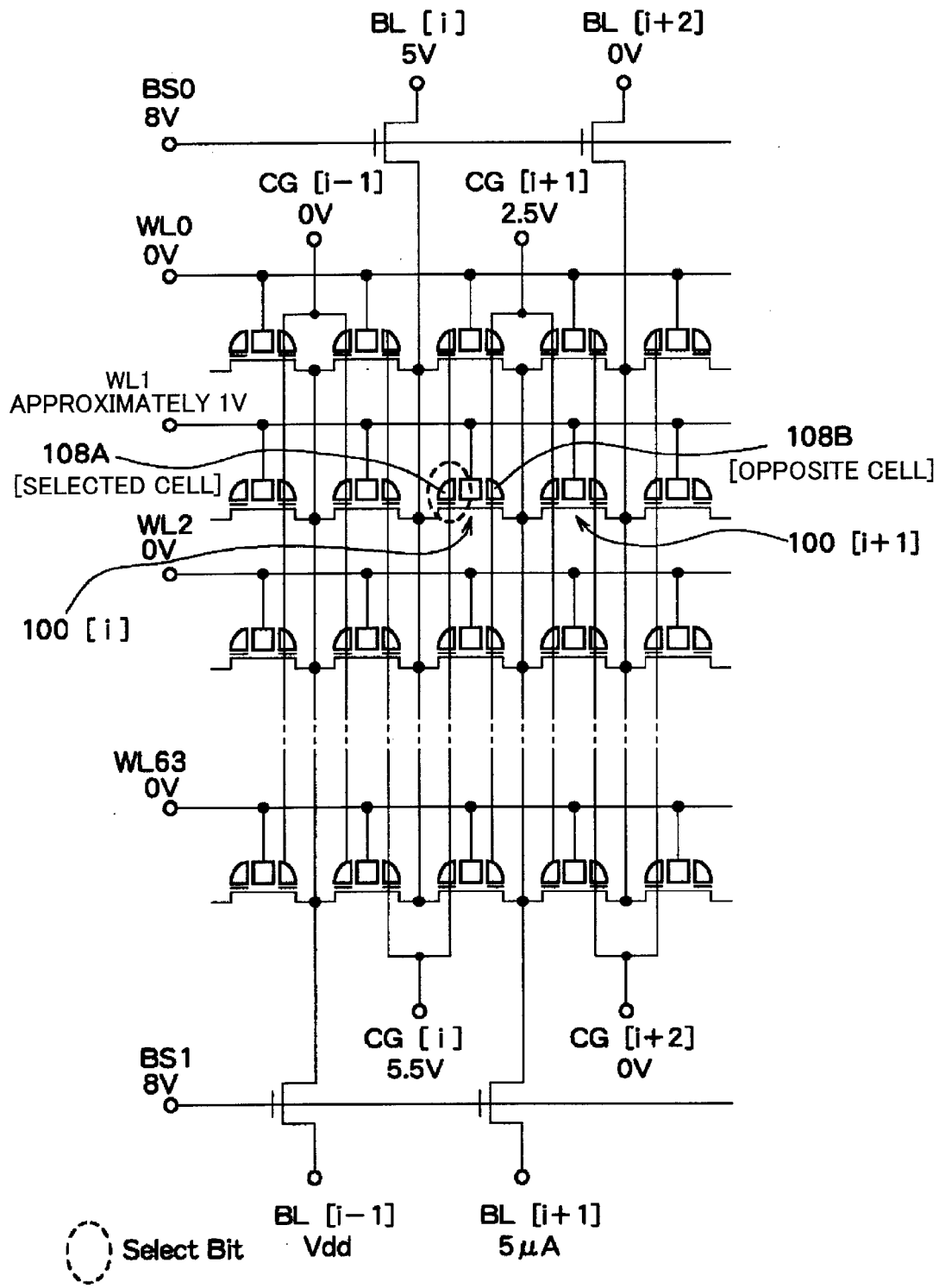
FIG. 20 is a schematic explanatory diagram for explaining the settings of voltages within the selected block in the data programming mode, for the memory element at the side different from that in FIG. 18.

In order to program the left MONOS memory element 108A of the memory cell 100 [i], the potentials of the various positions of the memory cells 100 [i−1], [i], [i+1] may be set as shown in FIG. 20.

Data Erasing of Memory Cell

Figure 21:
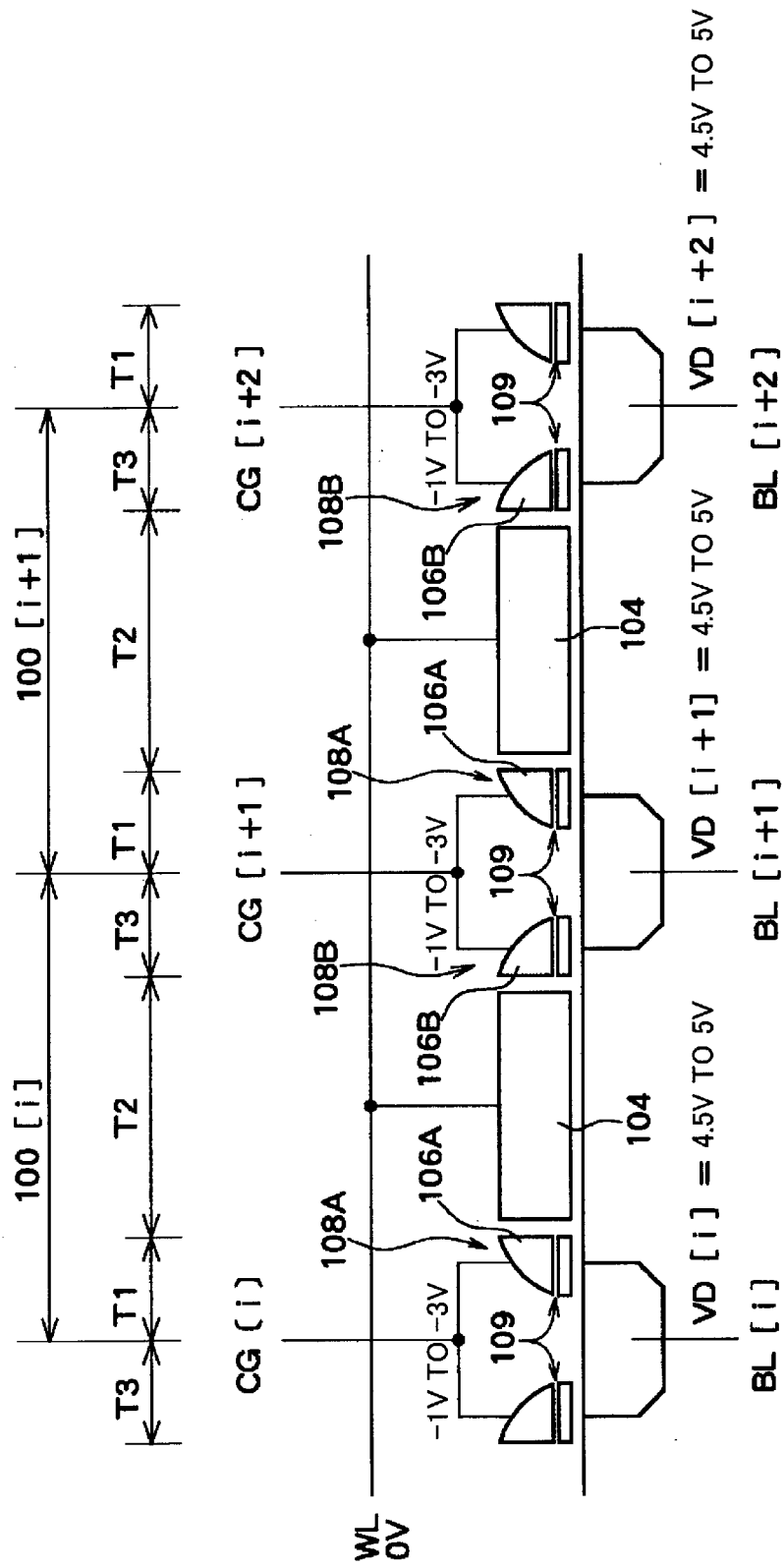
FIG. 21 is a schematic explanatory diagram for explaining a data erasing operation in the nonvolatile semiconductor storage device shown in FIG. 1.
Figure 22:
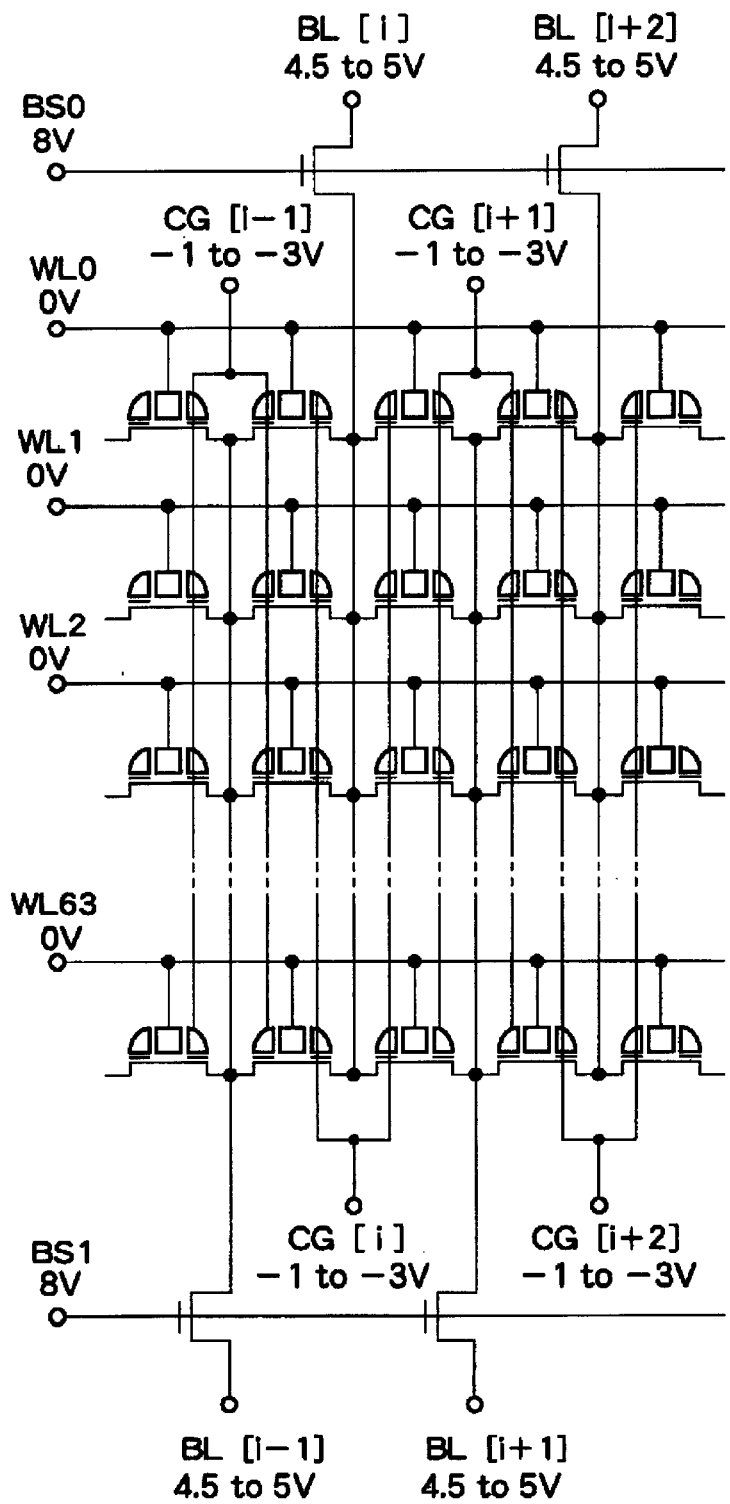
FIG. 22 is a schematic explanatory diagram for explaining the settings of voltages within the selected block in the data erasing mode.

FIG. 21 is a schematic explanatory diagram in the case of erasing data collectively from all the memory cells in the sector 0, and the situation of set voltages for some of the memory cells in the sector 0 is shown in FIG. 22.

Referring to FIG. 21, the potentials of the word gates 104 are set at 0V by the word line WL, and the potentials of the control gates 106A, 106B are set at an erasing control gate line voltage VNCG of, for example, −1V to −3V or so by the sub control gate lines SCG [i−1], [i], [i+1], [i+2]. Further, the potentials of the bit lines BL [i−1], [i], [i+1], [i+2] are set at an erasing bit line voltage of, for example, 4.5 to 5 V by the bit line selection transistors 217A, 217B and the bit line drivers.

Thus, electrons having been trapped in the ONO films 109 of the MONOS memory elements 108A, 108B are extracted away by a tunnel effect on the basis of an electric field which is formed by the erasing control gate voltage applied to the control gates, and the erasing bit line voltage applied to the bit lines. In this way, it is permitted to simultaneously erase data from the plurality of memory cells. Incidentally, an erasing operation may well be such that, unlike in the foregoing, hot holes are formed by band—band tunneling at the surfaces of impurity layers serving as bits, thereby to extinguish electrons having been stored.

Besides, the collective erasing of data within the sector is not restrictive, but data may well be erased in time division.

Booster Circuit

FIG. 23 is an equivalent circuit diagram showing an example of the booster circuit 800 shown in FIG. 11.

The booster circuit 800 is a circuit for boosting the supply voltage Vdd to a predetermined voltage, and it includes capacitance elements C1, C2, C3, . . . . The example of the booster circuit 800 in FIG. 23 is driven by 2-phase clocks CK, /CK. However, the booster circuit 800 is not restricted to the drive by the 2-phase clocks, but it may well be driven by, for example, 4-phase clocks.

Now, the practicable constructions of the capacitance elements C will be described. Incidentally, the constructions of the capacitance elements of two sorts (first and second capacitance elements) will be referred to below.

First Capacitance Element

The first capacitance element will be described with reference to FIGS. 24 to 28.

Figure 24:
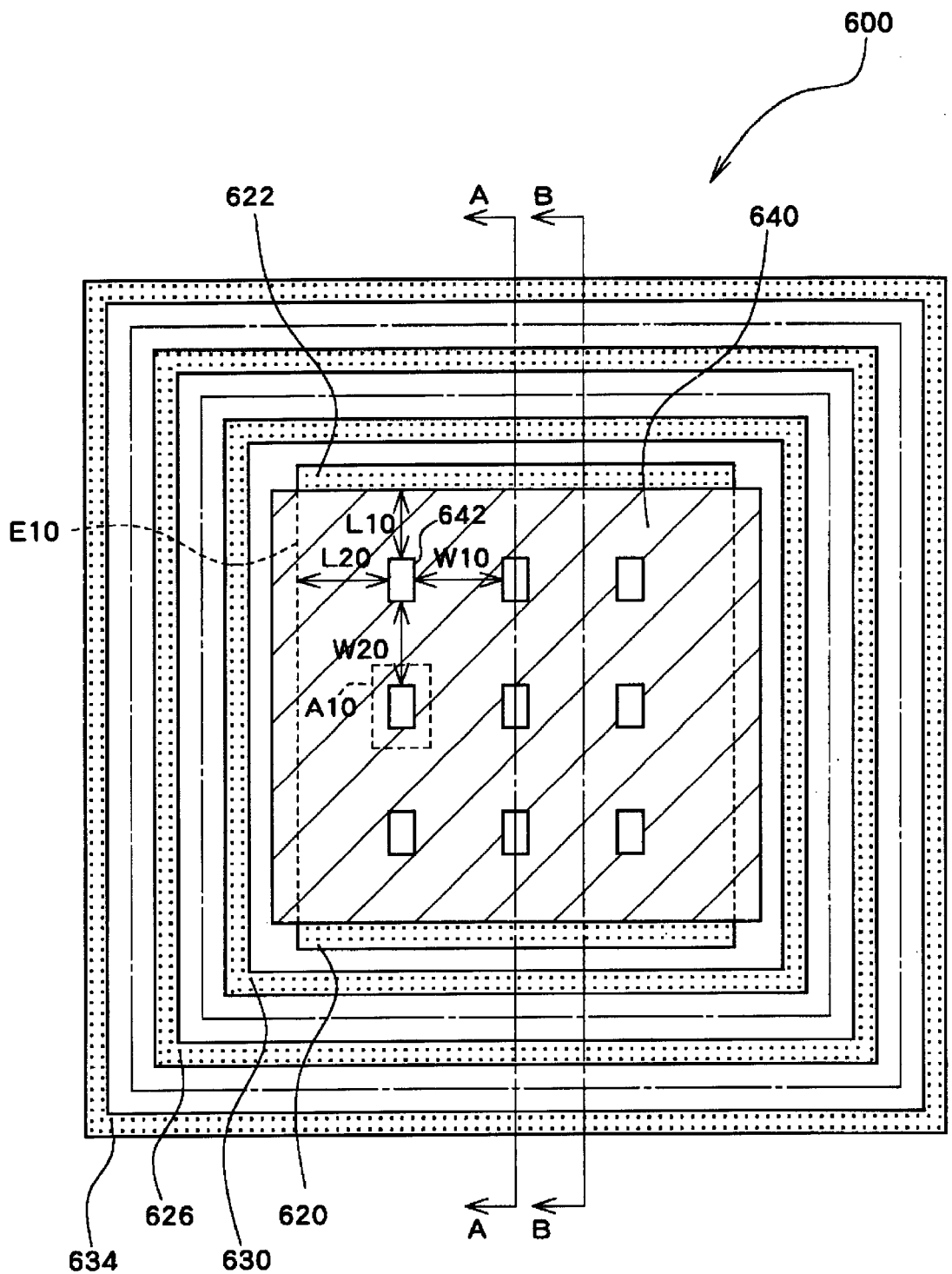
FIG. 24 is a plan view schematically showing a first capacitance element.
Figure 25:
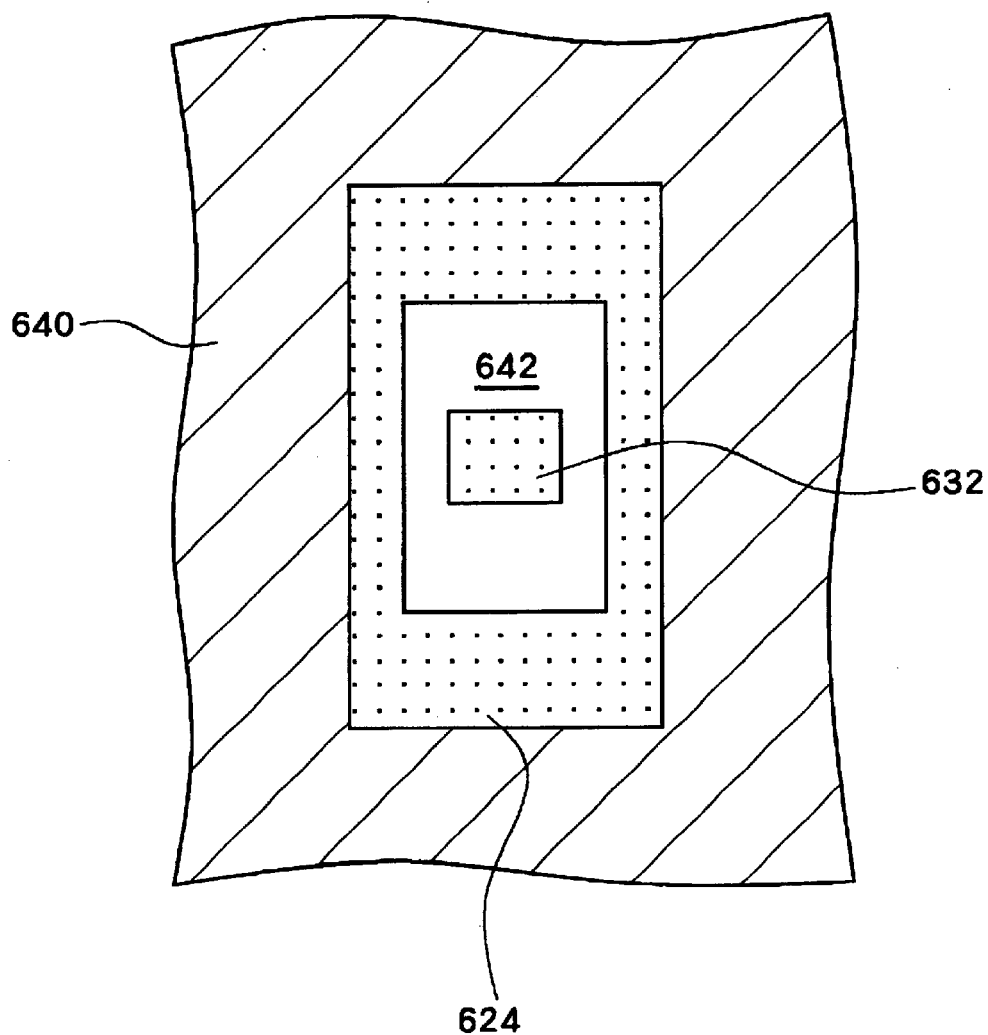
FIG. 25 is a plan view showing an area A10 in FIG. 24, on an enlarged scale.
Figure 26:
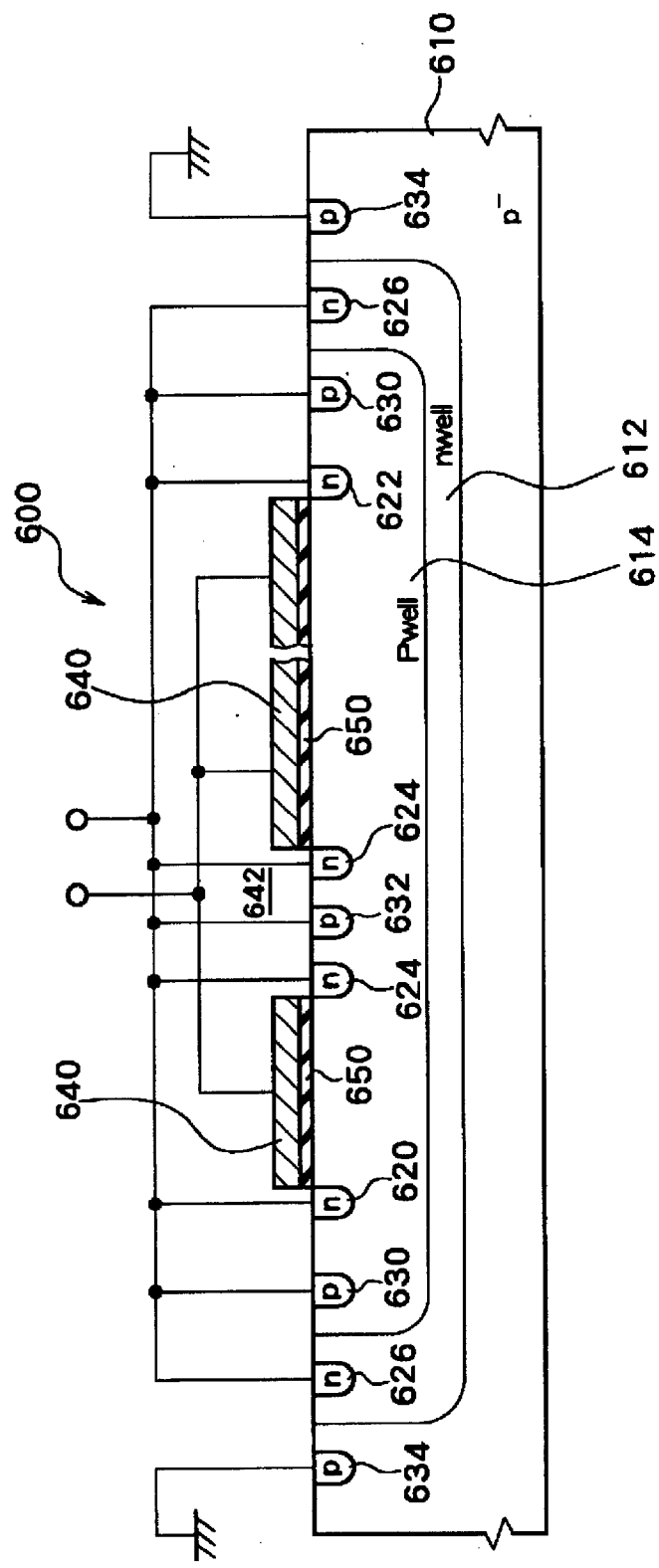
FIG. 26 is a sectional view schematically showing a section taken along line A—A in FIG. 24.
Figure 27:
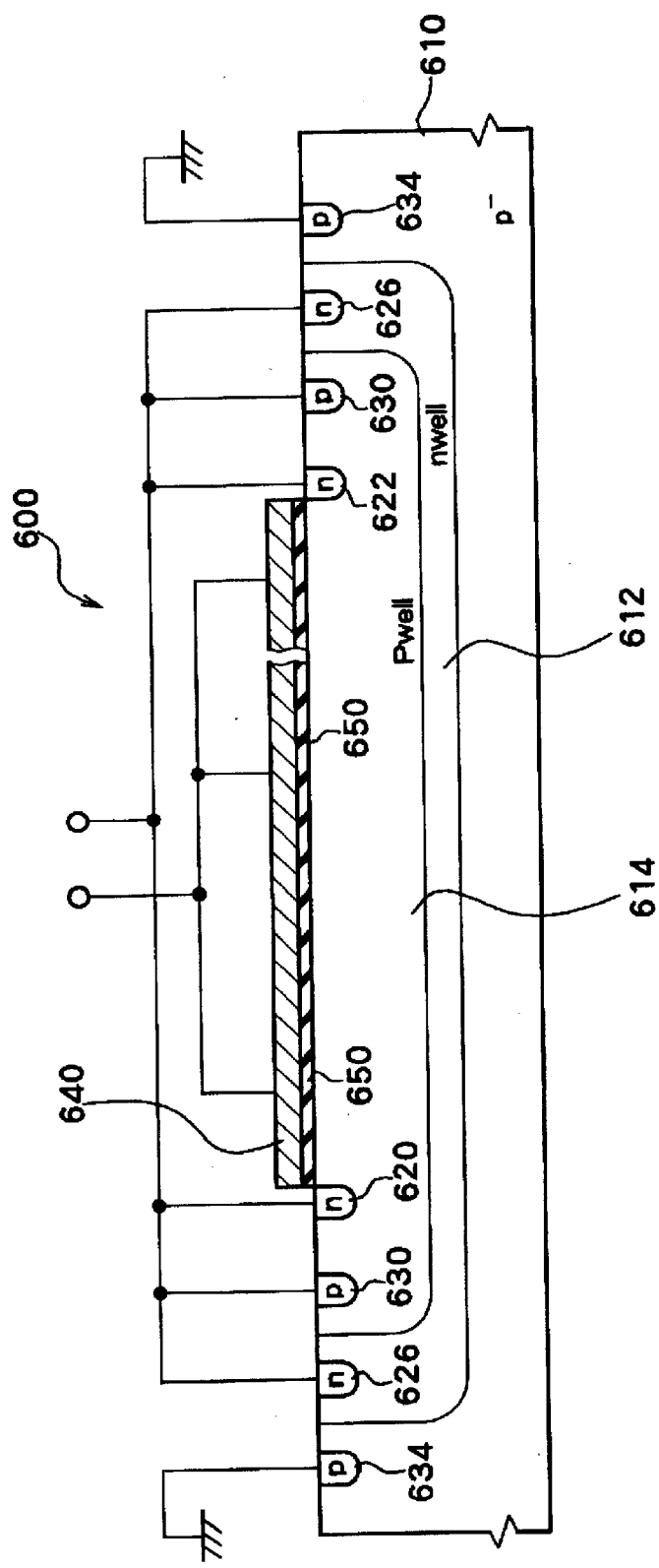
FIG. 27 is a sectional view schematically showing a section taken along line B—B in FIG. 24.
Figure 28:
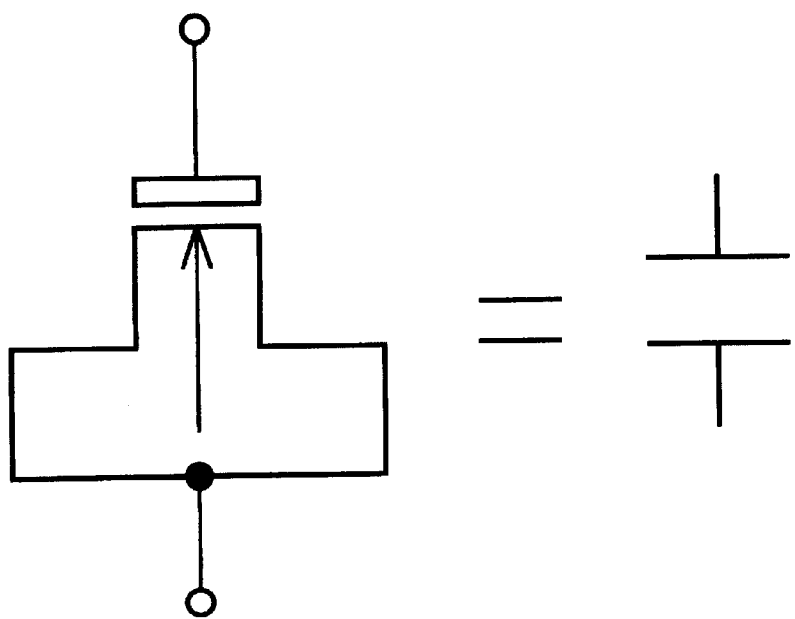
FIG. 28 is a diagram showing an equivalent circuit concerning the first capacitance element.

FIG. 24 is a plan view schematically showing the first capacitance element. FIG. 25 is a plan view showing an area A10 in FIG. 24, on an enlarged scale. FIG. 26 is a sectional view schematically showing a section taken along line A—A in FIG. 24. FIG. 27 is a sectional view schematically showing a section taken along line B—B in FIG. 24. FIG. 28 shows an equivalent circuit which concerns the first capacitance element. In the illustration of FIG. 26, a through hole is locally enlarged relative to the entirety.

The first capacitance element 600 is constructed of an N-type MOS capacitor. More specifically, the first capacitance element 600 includes a gate electrode layer 640, an insulating layer 650, and first to third N-type impurity layers 620, 622, 624 which function as source/drain regions.

An N-type well region 612 is provided in a P-type semiconductor layer (for example, P-type silicon substrate) 610. A P-type well region 614 is provided in the N-type well region 612.

The gate electrode layer 640 is provided over the P-type well region 614 through the insulating layer 650. This gate electrode layer 640 is made of, for example, polysilicon. In order to attain a low resistance, the gate electrode layer 640 can be formed of a stacked structure consisting of a polysilicon layer and a silicide layer (cobalt silicide layer).

The first N-type impurity layer 620 is formed in that part of the P-type well region 614 which lies at one side of the gate electrode layer 640. The second N-type impurity layer 622 is formed in that part of the P-type well region 614 which lies at the other side of the gate electrode layer 640. The first and second N-type impurity layers 620, 622 function as the source/drain regions of the MOS capacitor.

In the P-type well region 614, a first P-type impurity layer 630 is provided so as to surround the gate electrode layer 640 and the first and second N-type impurity layers 620, 622. The first P-type impurity layer 630 functions as a contact region for feeding a potential to the P-type well region 614. This first P-type impurity layer 630 is connected in common with the first and second N-type impurity layers 620, 622.

In the N-type well region 612, a fourth N-type impurity layer 626 is provided for feeding a potential to this N-type well region 612. The fourth N-type impurity layer 626 is connected in common with the first and second N-type impurity layers 620, 622 and the first P-type impurity layer 630.

A third P-type impurity layer 634 is provided in the P-type semiconductor layer 610. The third P-type impurity layer 634 functions as a contact region for feeding the ground potential to the P-type semiconductor layer 610.

A plurality of through holes 642 are provided in the gate electrode layer 640 as well as the gate insulating layer 650. The plurality of through holes 642 are provided at predetermined intervals (preferably, at equal intervals) in each of the row and column directions. The interval W10 of the through holes in the row direction is, for example, 5 to 40 μm, while the interval W20 of the through holes in the column direction is, for example, 5 to 40 μm. Besides, a distance L10 from the end of the gate electrode layer 640 to the through hole 642 is, for example, 2 to 20 μm. Further, a distance L20 from the end E10 of a region where an inversion layer is formed, to the through hole 642 is, for example, 2 to 20 μm.

As shown in FIG. 25, the third N-type impurity layer 624 is provided in the peripheral edge of that part of the P-type well region 614 which opposes to each corresponding through hole 642. This third N-type impurity layer 624 functions as the source or drain region of the MOS capacitor. Besides, in that part of the P-type well region 614 which opposes to the corresponding through hole 642, a second P-type impurity layer 632 is provided so as to be surrounded with the third N-type impurity layer 624. The second P-type impurity layer 632 functions as a contact region for feeding a potential to the P-type well region 614. The third N-type impurity layer 624 and the second P-type impurity layer 632 are connected in common with the first and second N-type impurity layers 620, 622.

The functional effects of the first capacitance element 600 will be described below.

Figure 33:
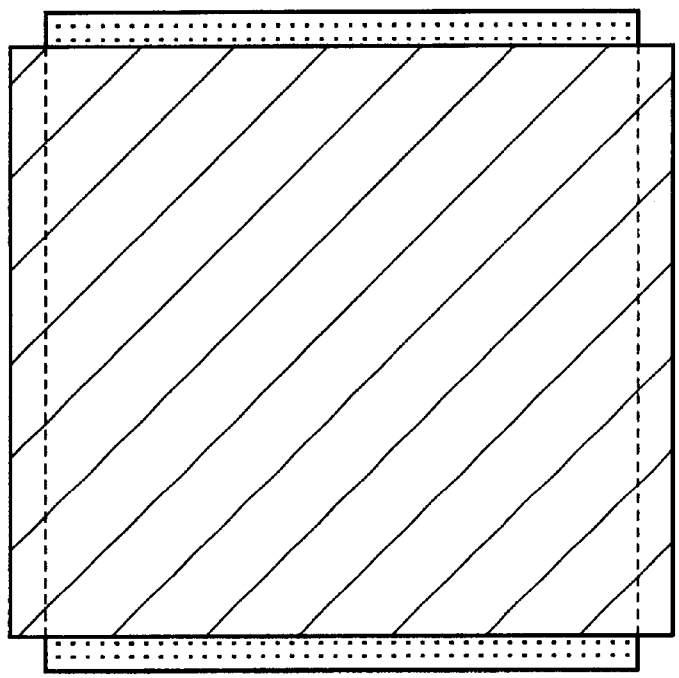
FIG. 33 is a plan view showing a capacitance element according to a comparative example.

(1) Each through hole 642 is formed in the gate electrode layer 640, and the third N-type impurity layer 624 is formed in that part of the P-type well region 614 which opposes to the through hole 642. Therefore, the resistance between the source and drain regions of the MOS capacitor can be made lower than in case of a capacitance element provided with no through hole as shown in FIG. 33. More specifically, since the third N-type impurity layer 624 is provided between the first N-type impurity layer 620 and the second N-type impurity layer 622, the resistance between the source and drain regions can be lowered. As a result, the inversion layer of the MOS capacitor is easily formed even in a region which is spaced from the first and second N-type impurity layers 620, 622.

(2) The first capacitance element 600 adopts a triple well structure which is composed of the P-type semiconductor layer 610, the N-type well region 612 and the P-type well region 614. Owing to the triple well structure, the voltage characteristic of the MOS capacitor can be enhanced on the low voltage side thereof. That is, the capacitance of the capacitance element per unit area can be enlarged on the low voltage side.

Moreover, owing to the triple well structure, the capacitance element is useful for a booster circuit which generates a negative voltage.

(3) The second P-type impurity layer 632 for feeding the potential to the P-type well region 614 is formed in that part of the P-type well region 614 which opposes to the through hole 642, whereby the parasitic resistance of the P-type well region 614 can be lowered. As a result, the voltage characteristic of the MOS capacitor can be enhanced more.

Second Capacitance Element

Figure 29:
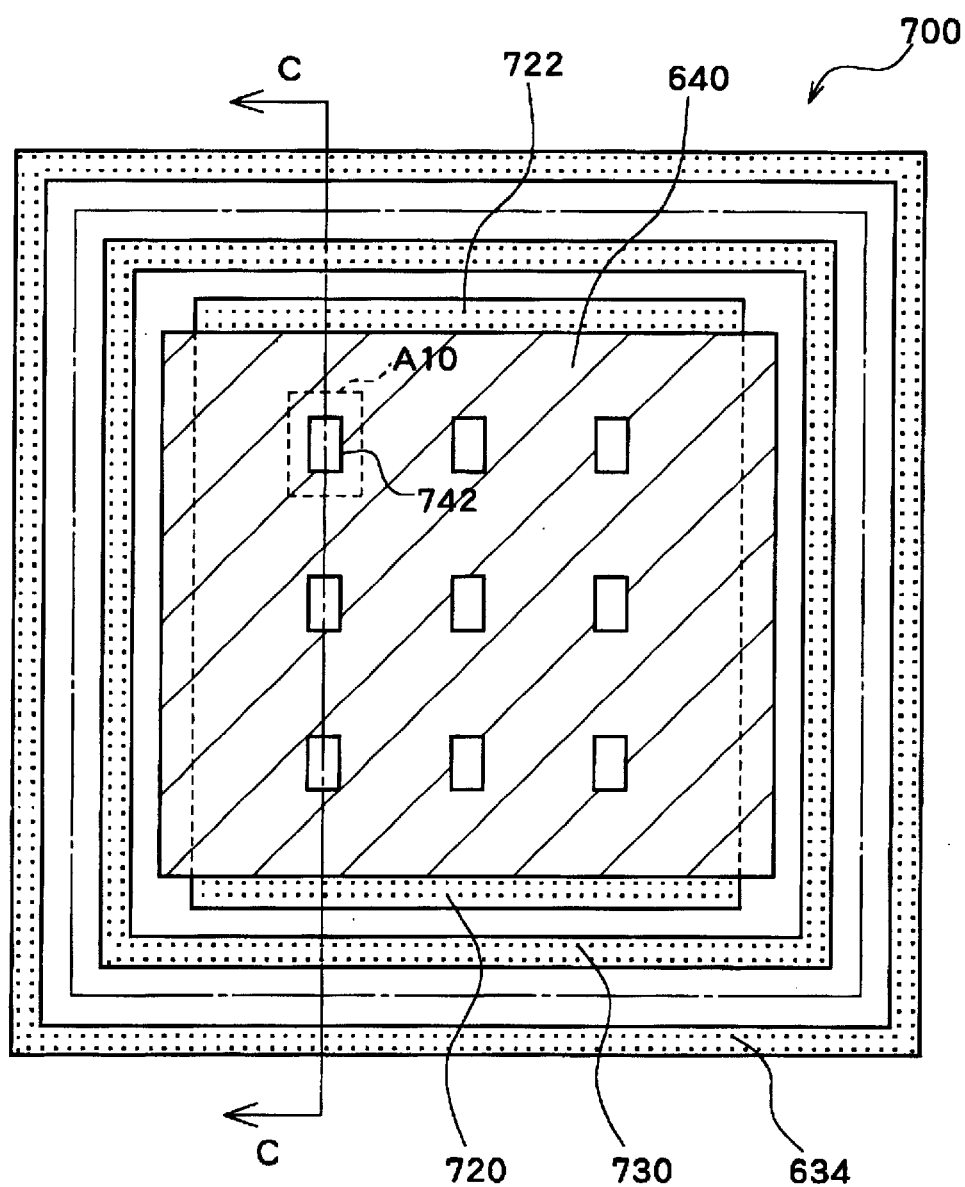
FIG. 29 is a plan view schematically showing a second capacitance element.
Figure 30:
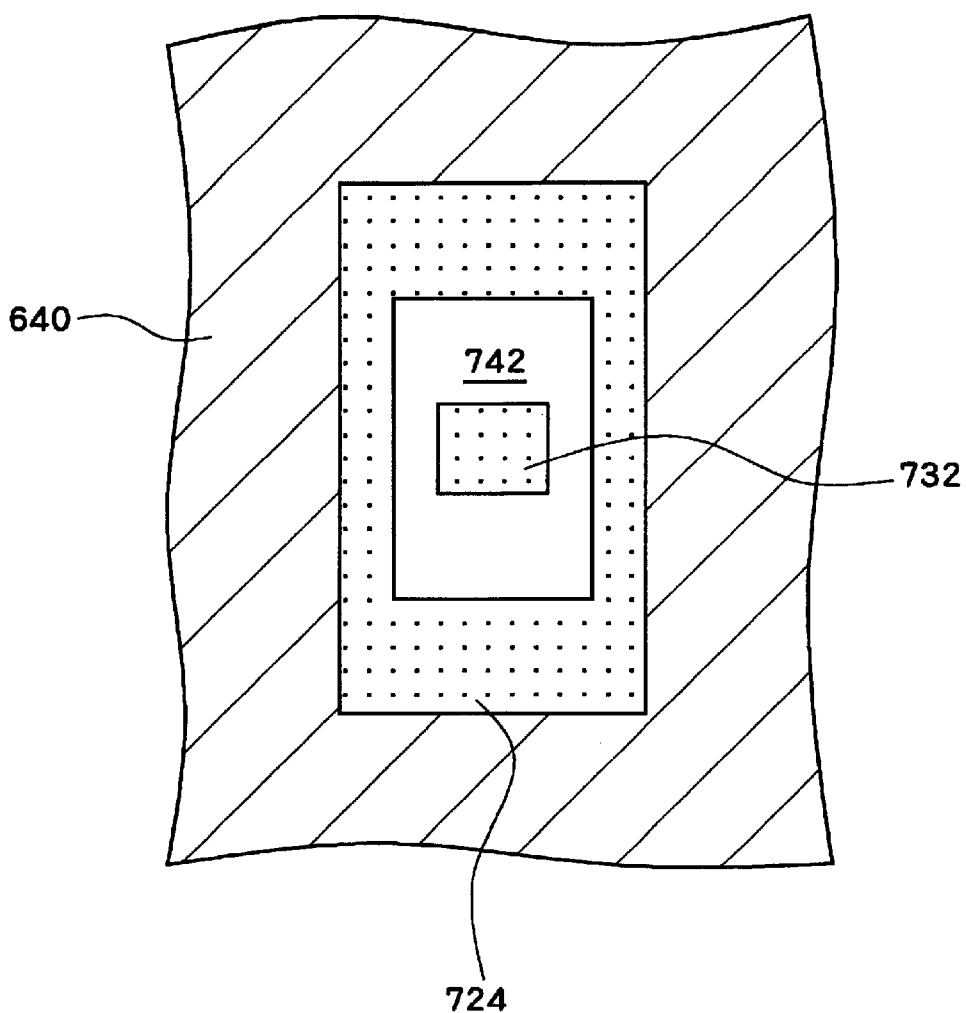
FIG. 30 is an enlarged plan view of an area A10 in FIG. 29.
Figure 31:
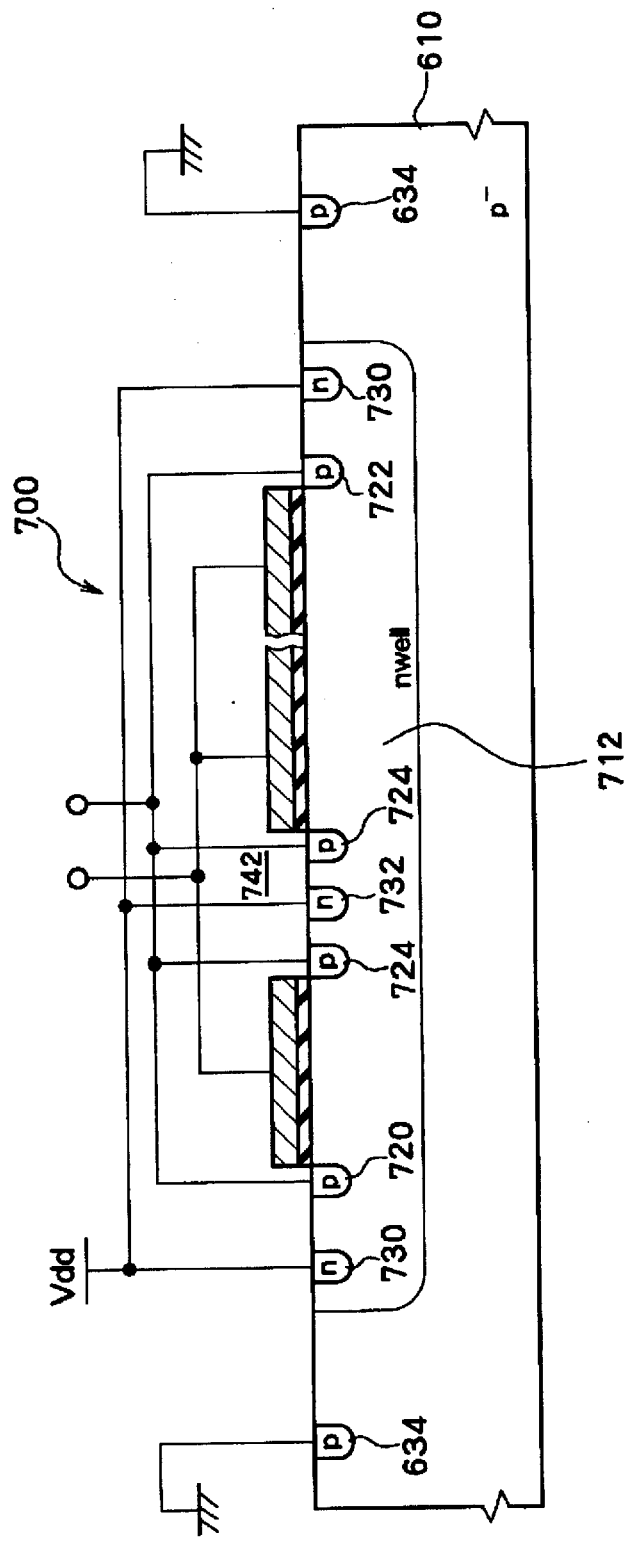
FIG. 31 is a sectional view schematically showing a section taken along line C—C in FIG. 29.
Figure 32:
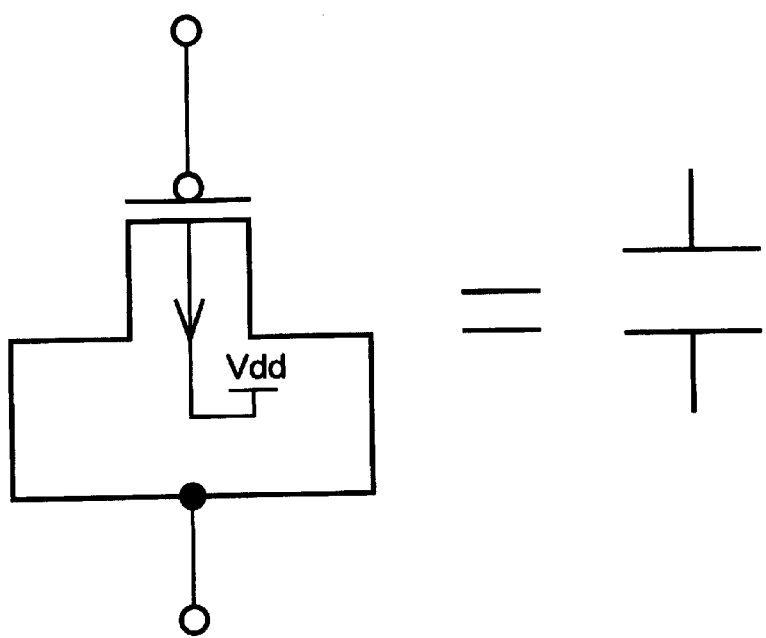
FIG. 32 is a diagram showing an equivalent circuit concerning the second capacitance element.

The second capacitance element will be described below. FIG. 29 is a plan view schematically showing the second capacitance element. FIG. 30 is a plan view showing an area A10 in FIG. 29, on an enlarged scale. FIG. 31 is a sectional view schematically showing a section taken along line C—C in FIG. 29. FIG. 32 shows an equivalent circuit which concerns the second capacitance element. In the illustration of FIG. 31, a through hole is locally enlarged relative to the entirety.

The second capacitance element 700 differs from the first capacitance element 600 in point of being a P-type MOS capacitor. That is, the source and drain regions of the MOS capacitor are formed of fourth to sixth P-type impurity layers 720, 722, 724. Concretely, the second capacitance element 700 differs from the first capacitance element 600 in the following points:

According to the second capacitance element 700, the fourth to sixth P-type impurity layers 720, 722, 724 functioning as the source and drain regions of the MOS capacitor are provided in an N-type well region 712 which is formed in a P-type semiconductor layer 610. These fourth to sixth P-type impurity layers 720, 722, 724 are connected in common with one another. The fourth P-type impurity layer 720 is formed in that part of the N-type well region 712 which lies at one side of a gate electrode layer 640. The fifth P-type impurity layer 722 is formed in that part of the N-type well region 712 which lies at the other side of the gate electrode layer 640. The sixth P-type impurity layer 724 is formed in that part of the N-type well region 712 which opposes to the through hole 742.

Besides, in driving the booster circuit, the N-type well region 712 is fed with the supply voltage Vdd through fifth and sixth N-type impurity layers 730, 732 which are provided in this N-type well region 712.

Further, as shown in FIG. 27, the sixth P-type impurity layer 724 is provided in the peripheral edge of that part of the N-type well region 712 which opposes to the through hole 742. In addition, the sixth N-type impurity layer 732 is provided so as to be surrounded with the sixth P-type impurity layer 724.

Since the other constituents are the same as in the first capacitance element 600, they shall be omitted from detailed description by assigning identical reference numerals to the parts having the same functions, respectively.

The second capacitance element 700 can achieve functional effects as described below by way of example.

(1) Each through hole 742 is formed in the gate electrode layer 640, and the sixth P-type impurity layer 724 is formed in that part of the N-type well region 712 which opposes to the through hole 742. Therefore, the resistance between the source and drain regions of the MOS capacitor can be made lower than in the case of the capacitance element provided with no through hole as shown in FIG. 33. More specifically, since the sixth P-type impurity layer 724 is provided between the fourth P-type impurity layer 720 and the fifth P-type impurity layer 722, the resistance between the source and drain regions can be lowered. As a result, the inversion layer of the MOS capacitor is easily formed even in a region which is spaced from the fourth and fifth P-type impurity layers 720, 722.

(2) The sixth N-type impurity layer 732 for feeding the potential to the N-type well region 712 is formed in that part of the N-type well region 712 which opposes to the through hole 742, whereby the parasitic resistance of the N-type well region 712 can be lowered. As a result, the voltage characteristic of the MOS capacitor can be enhanced more.

(3) The second capacitance element 700 is well suited to a case where a boosted negative voltage is to be generated.

The present invention is not restricted to the foregoing embodiment, but it can be variously modified within the scope of the purport thereof.

What is claimed is:

1. A semiconductor capacitance device comprising:
   a P-type semiconductor layer;
   an N-type well region which is provided in the P-type semiconductor layer;
   a P-type well region which is provided in the N-type well region;
   an electrode layer which is provided over the P-type well region with an insulating layer interposed therebetween;
   a first N-type impurity layer which is provided in the P-type well region on one side of the electrode layer; and
   a second N-type impurity layer which is provided in the P-type well region on the other side of the electrode layer,
   wherein the electrode layer has at least one through hole; and wherein a third N-type impurity layer is provided in the P-type well region at a position facing the through hole.

2. The semiconductor capacitance device according to claim 1, wherein a P-type well contact region is provided in the P-type well region at a position facing the through hole; and wherein the third N-type impurity layer is provided so as to surround the P-type well contact region.

3. The semiconductor capacitance device according to claim 1, wherein the electrode layer has a plurality of the through holes which are arranged in first and second directions intersecting each other.

4. A booster circuit comprising the semiconductor capacitance device as defined in claim 1, as a boosting capacitor.

5. A nonvolatile semiconductor storage device comprising:

the booster circuit as defined in claim 4;

a memory cell array including a plurality of nonvolatile semiconductor storage elements; and a drive circuit which drives the nonvolatile semiconductor storage elements on the basis of an output of the booster circuit.

6. The nonvolatile semiconductor storage device according to claim 5, wherein each of the nonvolatile semiconductor storage elements includes one word gate, and first and second nonvolatile memory elements which are controlled by first and second control gates.

7. The nonvolatile semiconductor storage device according to claim 6, wherein each of the first and second nonvolatile memory elements includes an ONO film formed of an oxide film (O), a nitride film (N) and an oxide film (O), as a trap site for electric charges, and wherein data is programmed in the trap site.

8. A semiconductor capacitance device comprising:

a P-type semiconductor layer;

an N-type well region which is provided in the P-type semiconductor layer;

an electrode layer which is provided over the N-type well region with an insulating layer interposed therebetween;

a first P-type impurity layer which is provided in the N-type well region on one side of the electrode layer; and a second P-type impurity layer which is provided in the N-type well region on the other side of the electrode layer, wherein the electrode layer has at least one through hole; and wherein a third P-type impurity layer is provided in the N-type well region at a position facing the through hole.

9. The semiconductor capacitance device according to claim 8, wherein an N-type well contact region is provided in the N-type well region at a position facing the through hole; and wherein the third P-type impurity layer is provided so as to surround the N-type well contact region.

10. The semiconductor capacitance device according to claim 8, wherein the electrode layer has a plurality of the through holes which are arranged in first and second directions intersecting each other.

11. A booster circuit comprising the semiconductor capacitance device as defined in claim 8, as a boosting capacitor.

12. A nonvolatile semiconductor storage device comprising:

the booster circuit as defined in claim 11;

a memory cell array including a plurality of nonvolatile semiconductor storage elements; and a drive circuit which drives the nonvolatile semiconductor storage elements on the basis of an output of the booster circuit.

13. The nonvolatile semiconductor storage device according to claim 12, wherein each of the nonvolatile semiconductor storage elements includes one word gate, and first and second nonvolatile memory elements which are controlled by first and second control gates.

14. The nonvolatile semiconductor storage device according to claim 13, wherein each of the first and second nonvolatile memory elements includes an ONO film formed of an oxide film (O), a nitride film (N) and an oxide film (O), as a trap site for electric charges, and wherein data is programmed in the trap site.

* * * * *